(12) United States Patent
Diekmann et al.

(10) Patent No.: US 11,860,543 B2
(45) Date of Patent: Jan. 2, 2024

(54) TRANSPORT SYSTEM AND METHOD FOR PRINTING PLATES

(71) Applicant: Esko-Graphics Imaging GmbH, Itzehoe (DE)

(72) Inventors: Christian Diekmann, Hohenlockstedt (DE); Jörg Koberg, Itzehoe (DE); Jörg Wolterink, Oelixdorf (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 88 days.

(21) Appl. No.: 15/734,434

(22) PCT Filed: Apr. 3, 2020

(86) PCT No.: PCT/EP2020/059575
§ 371 (c)(1),
(2) Date: Dec. 2, 2020

(87) PCT Pub. No.: WO2020/229054
PCT Pub. Date: Nov. 19, 2020

(65) Prior Publication Data
US 2022/0055393 A1 Feb. 24, 2022

Related U.S. Application Data

(60) Provisional application No. 62/846,772, filed on May 13, 2019.

(51) Int. Cl.
*G03F 7/04* (2006.01)
*B41N 3/00* (2006.01)
(Continued)

(52) U.S. Cl.
CPC .......... *G03F 7/3064* (2013.01); *B41N 3/006* (2013.01); *B65H 3/14* (2013.01); *B65H 5/222* (2013.01);
(Continued)

(58) Field of Classification Search
CPC ......... G03F 7/3064; B41N 3/006; B65H 3/14; B65H 5/222; B41F 27/1206; B41P 2227/60; B41P 2227/62; B41P 2227/50
See application file for complete search history.

(56) References Cited

U.S. PATENT DOCUMENTS 3,981,583 A 9/1976 Tsuchida et al.
5,234,207 A * 8/1993 Lindstrom ........... B65H 3/0816
271/106

(Continued)

FOREIGN PATENT DOCUMENTS

CN 109417043 A 3/2019
EP 1253012 A2 10/2002
(Continued)

OTHER PUBLICATIONS

First Chinese Office Action for Chinese Application No. 202080003800.2, with English translation, dated Dec. 31, 2021, 26 pages.
(Continued)

Primary Examiner — Daniel J Colilla
(74) Attorney, Agent, or Firm — RatnerPrestia

(57) ABSTRACT

A plate handling system (500, 600) for transporting printing plates between workstations in a process workflow. A plurality of vacuum gripper end effectors (512) configured to grip the printing plates are mounted to a computer-controlled transporter (514) configured to translate in at least three orthogonal directions and to rotate about at least one rotational axis. At least one sensor (560) detects orientation of the plate relative to a staging location and a controller (630) causes the transporter to move based upon programmed instructions in accordance with information provided by the sensor. A mobile preparation table (1000) may be provided in the staging location. A thickness measurement system (1090) may be included in some embodiments.

61 Claims, 19 Drawing Sheets

(51) Int. Cl.
    *B65H 3/14*     (2006.01)
    *B65H 5/22*     (2006.01)
    *B65H 7/20*     (2006.01)
    *G03F 7/30*     (2006.01)

(52) U.S. Cl.
    CPC ............ *B65H 7/20* (2013.01); *B41P 2227/60* (2013.01); *B41P 2227/62* (2013.01)

(56) References Cited

U.S. PATENT DOCUMENTS

| | | | |
|---|---|---|---|
| 6,076,464 A * | 6/2000 | Okamura | B41F 27/1287 101/477 |
| 6,116,100 A | 9/2000 | Jehan | |
| 6,354,208 B1 | 3/2002 | Bos et al. | |
| 6,981,447 B2 | 1/2006 | Klein et al. | |
| 9,961,783 B2 | 5/2018 | Vronsky et al. | |
| 2005/0211123 A1 | 9/2005 | Montbleau et al. | |
| 2006/0174508 A1 * | 8/2006 | Govek | B41C 1/1083 34/448 |
| 2007/0261580 A1 * | 11/2007 | Otten | B41F 27/12 101/477 |
| 2010/0018422 A1 | 1/2010 | McGaire | |
| 2014/0261035 A1 * | 9/2014 | Koberg | B41F 27/005 101/389.1 |
| 2018/0229497 A1 | 8/2018 | Darrow et al. | |
| 2020/0016916 A1 | 1/2020 | Sievers et al. | |

FOREIGN PATENT DOCUMENTS

| | | |
|---|---|---|
| EP | 1579987 A1 | 9/2005 |
| TW | 201840442 A | 11/2018 |
| WO | 2008135866 A2 | 11/2008 |

OTHER PUBLICATIONS

European Communication pursuant to Article 94(3) for European Application No. 20 719 130.5, dated Mar. 3, 2022, 6 pages.

Japanese Notification of Reason for Rejection for Japanese Application No. 2021-522145, dated Nov. 24, 2022 with translation, 7 pages.

Japanese Notice of Reasons for Refusal for Japanese Application No. 2021-522145, dated Apr. 4, 2022, with translation, 7 pages.

International Search Report and Written Opinion for International Application No. PCT/EP2020/059575, dated Sep. 8, 2020, 18 pages.

* cited by examiner

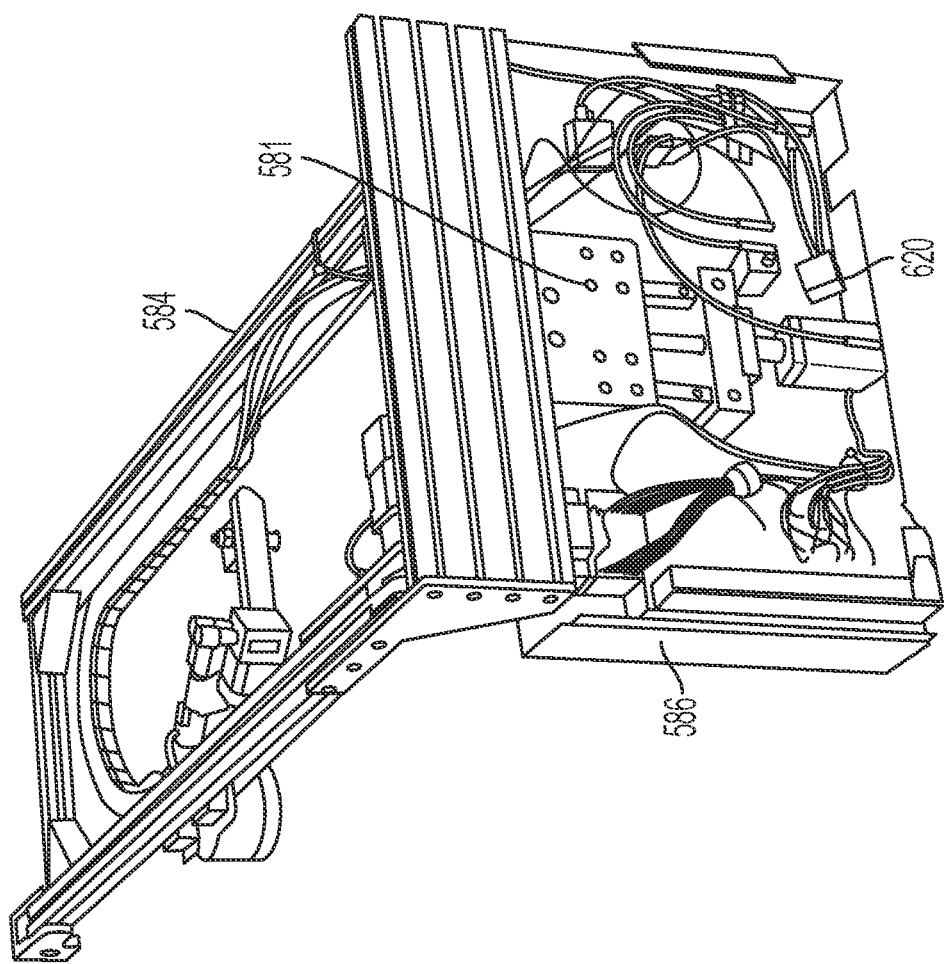

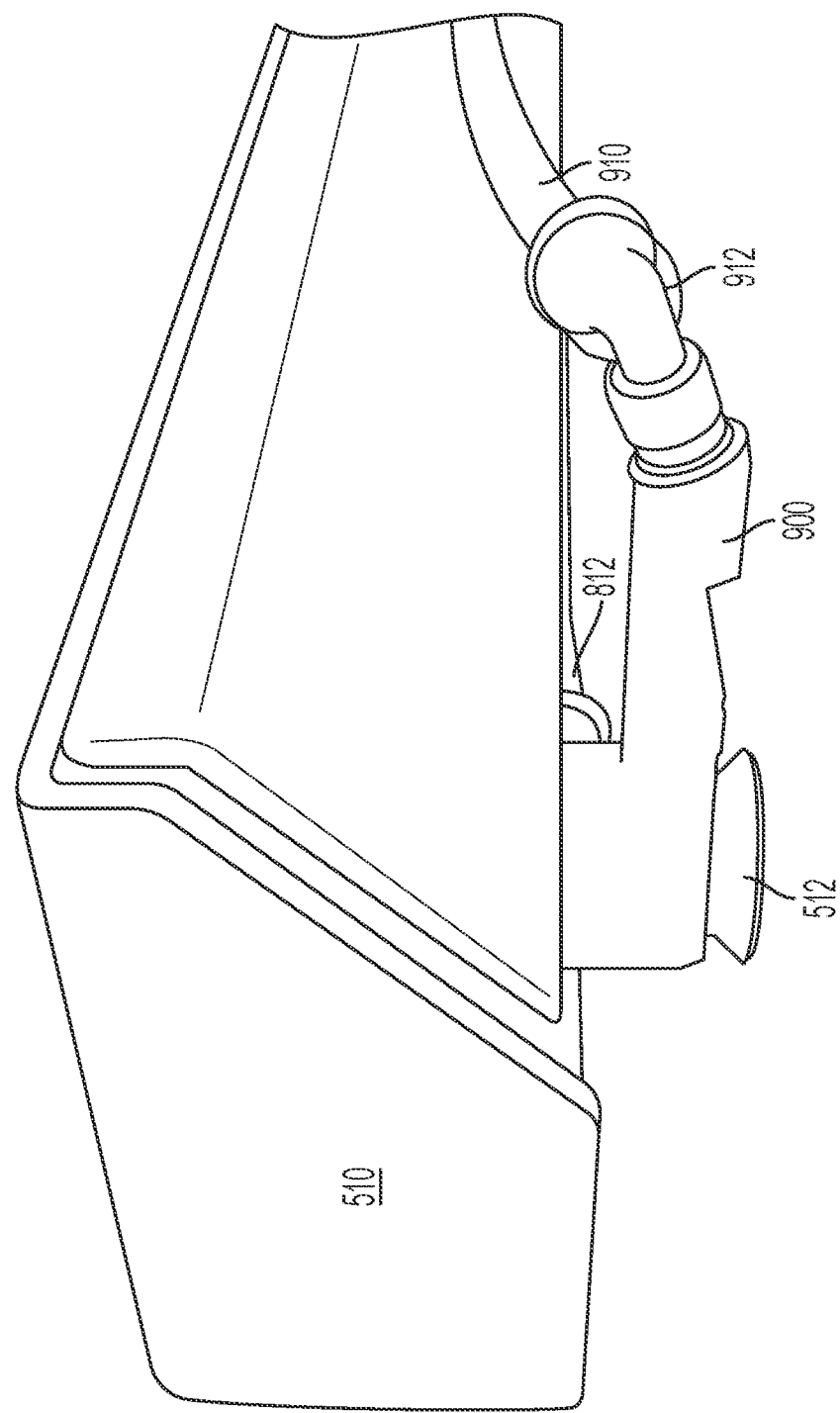

TRANSPORT SYSTEM AND METHOD FOR PRINTING PLATES

CROSS-REFERENCE TO RELATED APPLICATIONS

This patent application is a U.S. National Phase Patent Application of European PCT Application No. PCT/EP2020/059575, filed Apr. 3, 2020, titled TRANSPORT SYSTEM FOR PRINTING PLATES INCLUDING OPTIONAL MOBILE PREPARATION TABLE AND PLATE THICKNESS MEASUREMENT SYSTEM, which claims priority from U.S. Provisional Application Ser. No. 62/846,772, filed May 13, 2019, titled TRANSPORT SYSTEM FOR PRINTING PLATES, incorporated herein by reference in its entirety.

BACKGROUND OF THE INVENTION

Since the beginning of flexo printing with polymer plates, automated movement of the plates has been used for the transport of polymer plates inside the washing processor and preceding or following process steps. A typical process workflow includes portions in which plates are moved from an imaging station to a photopolymer curing (e.g. UV exposure) station to a plate washing station. Early systems used conveyor belts for transport from the curing station to the plate washing station. In some current systems, holes are punched into the plate at one side to fix the plate to a bar with pins that stick into the holes in the plate. The bar with the plate attached is then dragged through subsequent stages of the process. The use of conveyors and pin-gripping systems are not optimal for use in certain parts of the process.

Printing plate processing systems for photopolymer plates include an imager and a photopolymer curing station. In the exemplary prior art process workflow 100 depicted in FIG. 1A, an exposure unit in the nature of the Esko® XPS Crystal UV exposure unit 120 is depicted. In the XPS Crystal exposure unit, the printing plate lies flat on a glass table 122 to receive UV exposure from the front and the rear side from a moving linear stage 124 containing the UV sources. As a consequence of the orientation of this station, it is advantageous to have all other plate support surfaces for feeding and removing the plate from the imager also orientated horizontally. Workflow 100 comprises an imager in the nature of Esko® CDI Crystal imager 110, which comprises an opening slit 112 for receiving plates into, and discharging plates out of, the imager in the direction of arrow A. Inside the imager, the plate, which is imaged using Laser Ablated Mask (LAMS) technology, is received on a rotating drum (not shown), where the LAMS layer of the plate is imaged. A glass surface 114 provides a staging area for supporting the plates before they are loaded into and after they are discharged from imager 110 via slit 112. Slit 112 is oriented parallel to the main movement direction along arrow B from the imager to the exposer, and subsequently to the washing processor (not shown), meaning the plate has to be moved in two directions A and B, which are perpendicular (orthogonal) relative to one another.

Current automated plate transport systems do not cover all aspects of the typical workflow steps in such systems, and in particular, the steps of moving the plates from a plate reservoir and into the imager, which requires the plate to be precisely loaded, are typically not automated. Instead, a human operator 130 may have to position the plate with its leading edge in slit 112 where a clamp on the drum imager accepts the plate for further processing. The human operator 130 may interactively trigger various functions of the system by selecting options on one or more user interfaces 140, 142, each of which may comprise a touch screen display connected to a computer processor programmed with stored instructions and connected to various parts of the system necessary to perform the functions required of any automated portions of the system. As shown in FIG. 1A, a first touchscreen 140 and associated computer processor may operate imager 110, and a second touchscreen 142 and associated computer processor may operate exposure unit 120. In the system as depicted in FIG. 1A, the human operator also moves the plate onto the exposure unit 120 after it is discharged from the imager. Accordingly, there is a need in the art for improved systems for plate transport in a process workflow to reduce operator handling.

SUMMARY OF THE INVENTION

One aspect of the invention comprises a plate handling system for transporting printing plates between workstations in a process workflow. The system comprises a plurality of vacuum gripper end effectors configured to grip the printing plates and mounted to a computer-controlled transporter, the transporter configured to translate in at least three orthogonal directions and to rotate about at least one rotational axis. At least one sensor is configured for detecting orientation of the plate relative to at least one staging location in the process workflow. A controller, connected to the transporter and the at least one sensor, is configured to cause the transporter to move based upon programmed instructions in accordance with information provided by the sensor. The system may further comprise an air blade configured to direct an air stream between the plate and a surface on which the plate is disposed. The system is preferably configured to detect, with the sensor, a first position of the plate relative to the staging location, calculate movements required to place the plate in a preferred position relative to the staging location, and cause the transporter to perform the calculated movements. In certain embodiments, the system is configured to grip the printing plate in one or more areas on an upper surface of the plate, lift the gripped area of the plate along a Z-axis, rotate the plate about the Z-axis, and push or pull the plate along an XY plane.

In embodiments in which the printing plate comprises a photopolymer printing plate, the process workflow may comprise a plurality of sequential process stations comprising an imaging station, a photopolymer curing station, and a washing station. The at least one staging location may comprise a planar staging area located at an input of the imaging station. In such configurations, the plate handling system may be programmed to grip the printing plate in any one of a plurality of areas on an upper surface of the plate, lift the plate, and push or pull the plate into the various locations of the workflow. For example, the system may be configured to perform any or all of the following:

grip the printing plate in a first area of the upper surface of the plate, lift the first area of the plate, and push the plate into a plate loading position of imaging station;

grip the printing plate in the first area of the upper surface of the plate, lift the first area of the plate, and pull the plate away from a plate discharge position of imaging station; and grip the printing plate in a second area of the upper surface of the plate, lift the second area of the plate, and pull the plate onto the exposure station;

grip the printing plate in a third area of the upper surface of the plate, lift the third area of the plate, and push the plate to a pre-processing position for the washing station; and grip an area of the printing plate, lift the gripped area of the plate, and move the plate from the plate reservoir station to the at least one staging marked location.

In one embodiment, the transporter comprises a carriage configured to translate in an X direction, a Y linear stage connected to the carriage and configured to translate in a Y direction orthogonal to the X direction, a rotation stage connected to the Y linear stage and configured to rotate about a Z axis orthogonal to the X and Y directions, and a Z linear stage connected to the carriage and configured to translate along a Z direction orthogonal to the X and Y directions. The sensor may comprise a contrast sensor configured to detect a difference in reflection characteristics of an object at a given wavelength or range of wavelengths, and the at least one staging location may comprise a planar surface having reflection characteristics, which in some embodiments may comprise markings, differing from the reflection characteristics of the printing plate to a degree detectable by the contrast sensor. The staging location may have markings in the form of at least three stripes, including at least one first stripe oriented parallel to a first edge of the plate and positioned to intersect with opposite second and third edges of the plate orthogonal to the first edge, and at least two stripes oriented orthogonal to the at least one first stripe and configured to intersect with the first edge of the plate. In embodiments in which the staging location comprises a support transparent or translucent to a detection wavelength of the sensor, markings may be disposed on an underside of the transparent or translucent support opposite the upper surface of the support on which the lower surface of the plate rests.

In exemplary embodiments, the end effectors are configured to grip the printing plate on an upper surface of the plate and the process workflow comprises an imaging station configured to apply an image to the upper surface of the plate, and a photopolymer curing station comprising a support transparent or translucent to an actinic radiation, such as actinic UV radiation, emitted by the photopolymer curing station, wherein the photopolymer curing station is configured to irradiate both the upper surface and an opposite lower surface of the plate. The photopolymer curing station may comprise a linear stage configured to provide the actinic radiation, the curing station linear stage have a resting location relatively nearer a trailing end of the curing station than to a leading end of the curing station, in which embodiments the plate handling system may be configured to pull the plate onto the curing station in a direction from the leading edge to the trailing edge, deposit the plate in a curing location, and return to a location that does not interfere with transit of the curing station linear stage. In such embodiments, the plate handling system may also be configured to grab, lift, and push the plate from a trailing edge of the plate to move the plate from the curing location to a washing station receiving position in which at least a portion of the plate is located beneath the curing station linear stage in the resting position.

In embodiments in which the imaging system is a drum imaging system, such as an imaging system configured to apply the image to the upper surface of the plate by ablating a LAMS layer of the plate to form a mask, the imaging system may have a clamp for receiving a leading edge of the plate. In such embodiments, the plate handling system may be configured to grip an area of the upper surface of the plate adjacent a trailing edge of the plate and to push the plate into the imaging station until the leading edge of the plate is disposed in a clamp receiving position.

Another aspect of the invention comprises a method for processing a printing plate in a plurality of workstations in a process workflow. The method comprises providing a plate handling system for transporting the printing plate from one workstation to another in the process workflow. The plate handling system comprises a computer controlled transporter configured to translate in at least three orthogonal directions and to rotate about at least one rotational axis, end effectors for gripping the printing plates connected to the transporter, at least one sensor for detecting orientation of the plate relative to at least one staging location in the process workflow; and a process controller connected to the transporter, to the at least one sensor, and to a computer processor. Location and orientation of the plate to be transported are sensed by the at least one sensor and the transporter lifts the plate in a Z direction relative to an XY plane and moves the plate in one or both of X and Y directions, rotates the plate relative to a Z-axis, or a combination thereof. Optimally, the method further comprises during transport of the plate, directing an air stream between the plate and a surface on which the plate is disposed.

The method may comprise detecting (with the sensor) a first position of the plate relative to the staging location, calculating (with the process controller processor) movements required to place the plate in a preferred position relative to the staging location, and performing (with the transporter) the calculated movements. The method may comprise gripping the printing plate with the plate handling system in one or more areas on an upper surface of the plate, lifting the gripped area of the plate along the Z axis, and pushing or pulling the plate along the XY plane.

In embodiments in which the printing plate comprises a photopolymer printing plate, the process workflow comprises a plurality of sequential process stations comprising an imaging station, a photopolymer curing station, and a washing station. At least one staging location may be located at an input of the imaging station. In such embodiments, the method may comprise performing one or more of the following operations:

gripping the printing plate in a first area of an upper surface of the plate, lifting the first area of the plate, and pushing the plate into a plate loading position of the imaging station;

gripping the printing plate in the first area of the upper surface of the plate, lifting the first area of the plate, and pulling the plate away from a plate discharge position of the imaging station;

gripping the printing plate in a second area of the upper surface of the plate, lifting the second area of the plate, and pulling the plate onto the exposure station; and gripping the printing plate in a third area of the upper surface of the plate, lifting the third area of the plate, and pushing the plate to a pre-processing position for the washing station.

A plate reservoir station may be located sequentially before the imaging station. In some embodiments, the plate reservoir station is configured to receive a single plate, and the method comprises a human operator placing the plate at the plate reservoir station. The method may also comprise gripping the printing plate in the third area of the upper surface of the plate, lifting the third area of the plate, and pulling the plate to the at least one staging location.

In embodiments in which the sensor comprises a contrast sensor configured to detect a difference in reflection characteristics of an object at a given wavelength or range of wavelengths, the staging location may be a planar surface having at least portions thereof having reflection characteristics that differ from the reflection characteristics of the printing plate to a degree detectable by the contrast sensor, in which case the method comprises the sensor detecting an edge of the plate relative to planar surface of the staging location. In embodiments in which the staging location has markings, the staging location may be in the form of at least three stripes, including at least one first stripe oriented parallel to a first edge of the plate and positioned to intersect with opposite second and third edges of the plate orthogonal to the first edge, and at least two stripes oriented orthogonal to the at least one first stripe and configured to intersect with the first edge of the plate. In such embodiments, the method comprises the sensor detecting an edge of the plate relative to the detected stripes.

In some embodiments, the end effectors are configured to grip the printing plate on an upper surface of the plate, and the method comprises applying an image to the upper surface of the plate at an imaging station and irradiating both the upper surface and an opposite lower surface of the plate a photopolymer curing station. Where the method comprises curing the photopolymer plate using actinic radiation emitted from radiation sources mounted on a linear stage having a resting location relatively nearer a trailing end of the curing station than to a leading end of the curing station, the method may also comprise pulling the plate onto the curing station in a direction from the leading edge to the trailing edge using the transporter, depositing the plate in a curing location, and the transporter returning to a location that does not interfere with transit of the curing station linear stage. The method in such configurations may further comprise grabbing, lifting, and pushing the plate from a trailing edge of the plate to move the plate from the curing location to a washing station receiving position in which at least a portion of the plate is located beneath the curing station linear stage in the resting position. In systems in which the workflow comprises a drum imaging system having a clamp for receiving a leading edge of the plate, the method comprising gripping an area of the upper surface of the plate adjacent a trailing edge of the plate with the plate handling system and pushing the plate into the imaging station until the leading edge of the plate is disposed in a clamp receiving position.

Yet another aspect of the invention comprises a fitting for an end effector configured to grip a photopolymer printing plate, the photopolymer plate having an upper surface and a lower surface. The fitting comprises an air input configured to connect to an air supply, a venturi nozzle connected to the air input, a vacuum end effector connected to a vacuum-creating region of the venturi nozzle, the vacuum end effector positioned to contact an upper surface of the printing plate, and an air blade connected to an air outlet of the venturi nozzle, the air blade configured to discharge an air stream beneath the lower surface of the plate when the vacuum end effector is in contact with the upper surface of the printing plate. The air blade and vacuum end effector may have a fixed relationship relative to one another.

Another aspect of the invention comprises a plate handing system for transporting polymer printing plates and comprising the foregoing fitting, wherein the system is configured to lift, pull, and/or push the plates relative to a planar support surface with the end effector in contact with the upper surface of the plate and the air stream directed between the lower surface of the plate and the planar support surface.

Still another aspect of the invention comprises a method of transporting polymer printing plates in a process workflow, comprising lifting, pulling, and/or pushing the plates relative to the planar surface using a plate handling system having the foregoing fitting. The method comprises causing air to flow through the fitting with the end effector in contact with the upper surface of the plate while simultaneously discharging the air stream beneath the lower surface of the printing plate to reduce friction between the lower surface of the printing plate and the planar surface.

Yet another aspect of the invention comprises a non-transitory computer program product, readable by a machine, comprising instructions for operating the plate handling system as described herein. The computer program product includes machine-readable instructions for receiving information from the at least one sensor indicative of orientation of the plate relative to the at least one staging location, causing the plurality of vacuum gripper end effectors to selectively produce vacuum to provide a gripping function; and causing the transporter to translate in any of the at least three orthogonal directions and/or rotate about the at least one rotational axis in accordance with preprogrammed instructions and information provided by the sensor.

Another aspect of the invention, optionally for use with a plate handling system as described herein, includes a mobile preparation table configured to transport printing plates to and from a staging location. The mobile preparation table comprising a base having a frame and a plurality of wheels attached to the frame and configured to roll along a floor surface. A planar preparation surface has a frame pivotally attached to the frame of the base, and one or more physical connection interfaces configured to secure the base mechanically in a fixed position in the staging location; and a processor with a communication interface configured to exchange information between the mobile preparation table and the plate handling system. The mobile preparation table may have a mechanism for pivoting the planar preparation surface within a range of angles between a first position parallel to the floor surface and a second position at an angle relative to the first position. At least one sensor system configured to detect one or more characteristics of a plate positioned on the preparation surface, such as length of the plate, width of the plate, thickness of the plate, weight of the plate, and orientation and/or location of the plate relative to the preparation surface.

In some embodiments, the planar preparation surface of the mobile preparation table may be transparent. At least one sensor system of the mobile preparation table may comprise one or more photodetectors, such as in an embodiment in which at least one array of photodetectors is disposed relative to the transparent planar preparation surface configured to detect a portion of the plate disposed over a portion of the array based upon an absence of ambient light received by a portion of the array blocked by the presence of the plate.

In another embodiment, the at least one sensor system comprises a photopolymer layer thickness detector and the one or more photodetectors includes an array of photodetectors disposed beneath the transparent planar preparation surface. In this embodiment, the sensor system comprising a light source configured to emit a first beam angled toward the plate from beneath the transparent table, and the array configured to detect second and third beams reflected by transitions between the photopolymer layer and layers disposed adjacent the photopolymer layer. A thickness detector as described may be used on any transparent planar surface for receiving a plate.

Embodiments of the plate handling system as described herein may include at least one thickness detector configured for measuring thickness of a printing plate relative to a surface of the plate handling system defining an X-Y plane for receiving the printing plate. The thickness detector comprises a sensor positioner controllable in at least Y and Z axes disposed above the surface, a non-contact distance measurement sensor mounted on the positioner and configured to output a measurement signal indicative of distance along a Z axis perpendicular to the X-Y plane; and a processor configured to control the positioner and to receive a measurement signal from the sensor. The processor is programmed with instructions for: receiving information defining X-Y dimensions and expected location of the plate; moving the positioner to a first position disposed above a point on the surface not above the expected location of the printing plate; obtaining a reference Z-distance measurement signal from the sensor for use as a reference Z-distance between the sensor and the surface; moving the positioner to a second position disposed above a point on the surface above the expected location of the printing plate; and obtaining a second Z-distance measurement signal from the sensor and processing the second Z-distance measurement signal and the reference Z-distance measurement signal to obtain the measured thickness of the printing plate.

In systems in which the plate includes information encoded as differences in plate thickness along a predetermined path, and the system is further programmed with instructions for moving the positioner along the predetermined path while receiving measurement signals from the sensor, and processing the measurement signals so received to read the encoded information.

Other aspects of the invention include a mobile preparation table or any of the thickness measurements systems or components of any of the systems as described herein, not limited to other details included in any particular embodiment as described herein. Still other aspects include methods of using the apparatus and systems as described herein, and computer readable media programmed with computer executable instructions for carrying out suitable method steps by a machine, such as a computer processor and any of the system components as described herein in communication with that processor.

BRIEF DESCRIPTION OF THE DRAWINGS

FIG. 4F is a photograph showing a close-up view of selected portions of the exemplary prototype plate handler of FIG. 4D.

FIG. 5 is a flowchart of steps in an exemplary method corresponding to one or more aspects or embodiments of the invention.

FIG. 6A is a photograph showing a perspective view of an exemplary air blade/vacuum end effector system from a view at one end of the bar.

DETAILED DESCRIPTION OF THE INVENTION

The transport devices, systems and methods as described herein, generally relate to moving photopolymer plates lying on a flat horizontal support surface from one production process to the next. The plates are grabbed and lifted slightly by a vacuum gripper end effectors (i.e. suction cups), which in preferred arrangements, provides enough space to permit air to be blown between the plate and the support surface, creating an air cushion that reduces friction between plate and support surface. In exemplary systems, the plate is moved from a reservoir stack into the imager, after imaging it is moved to the UV exposure stage and after UV exposure, on to the washing processor. The system may comprise fewer than all of the above stations, however, and may be useable for transport of plate between any set of process step stations.

Figure 1A:
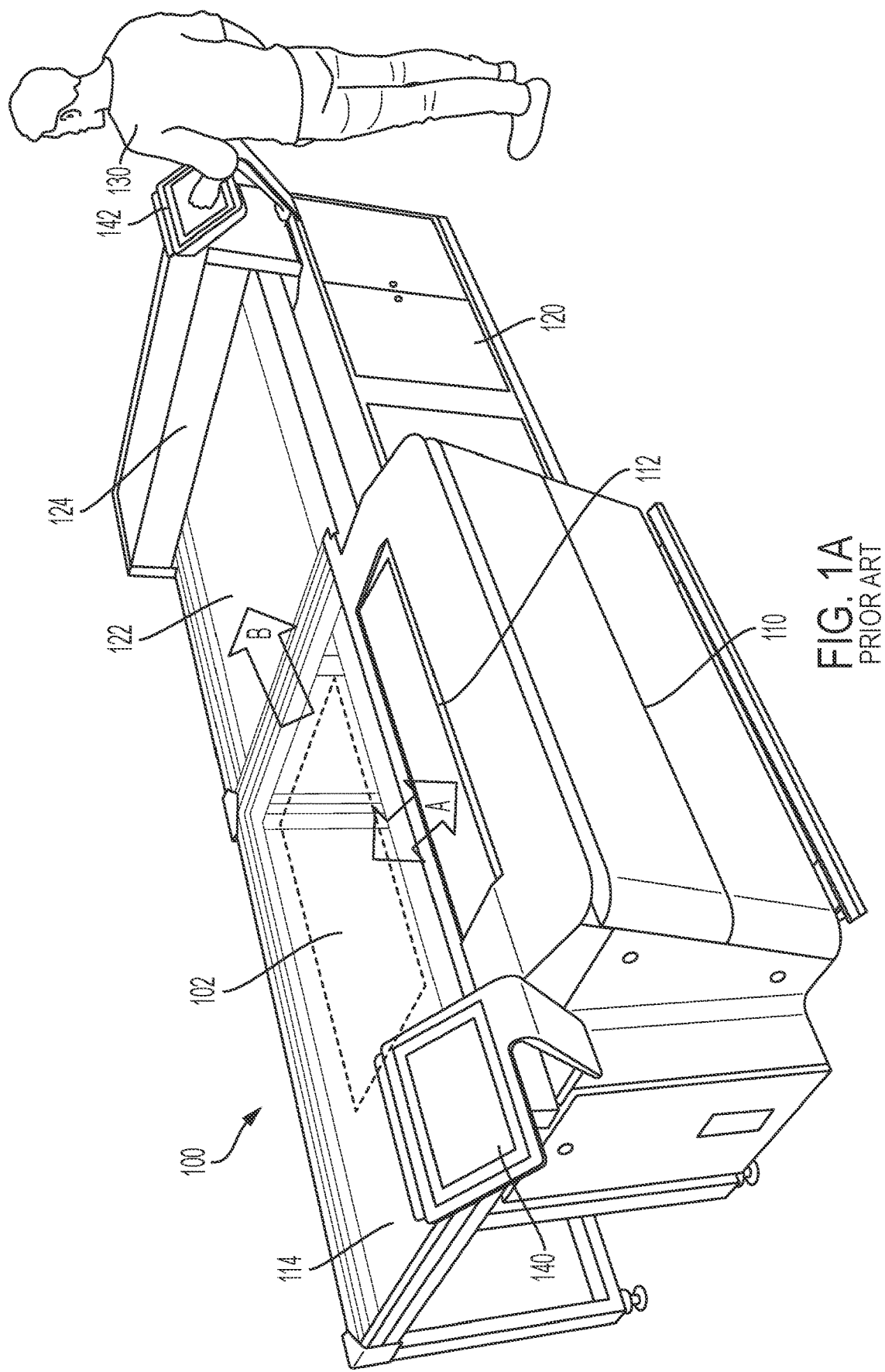
FIG. 1A is an image showing an exemplary plate processing workflow comprising an imaging station and an exposure curing station known in the prior art.
Figure 1B:
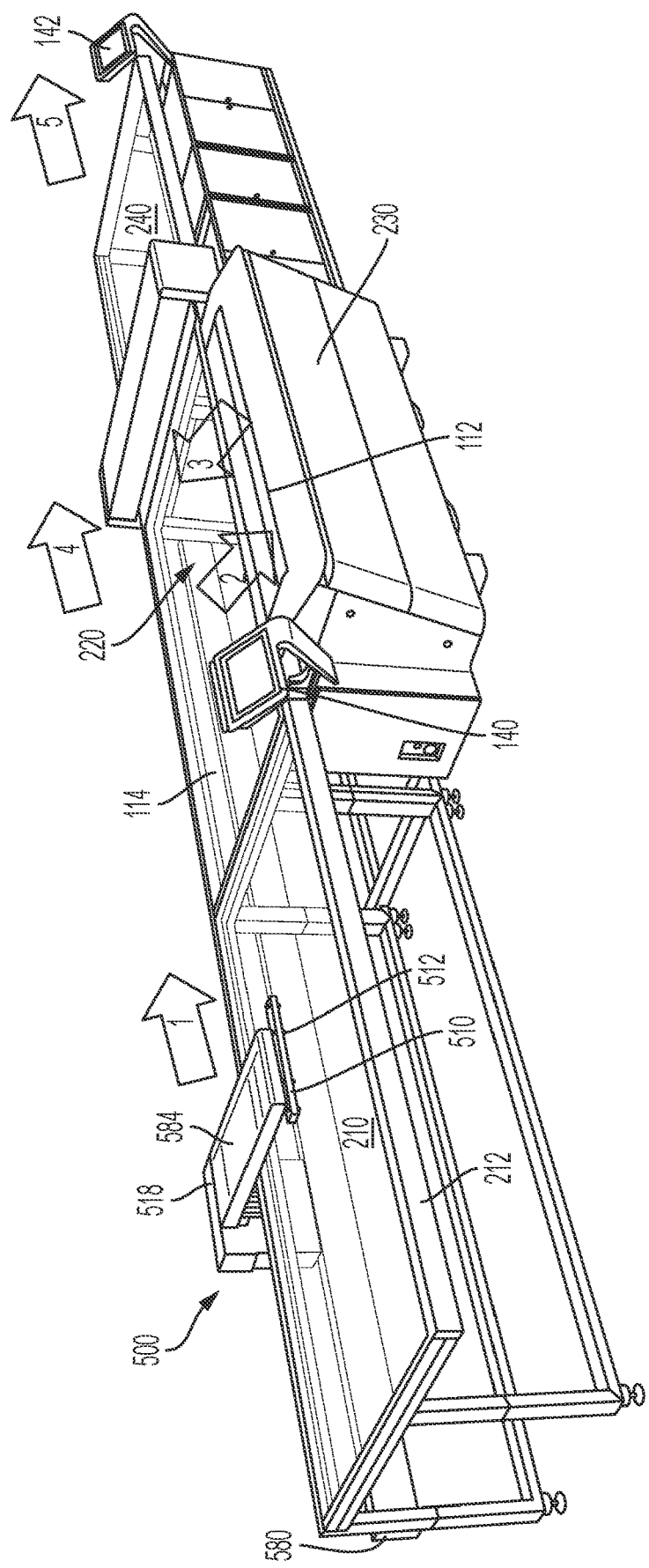
FIG. 1B is a depiction of an exemplary plate processing workflow comprising a plate reservoir station, an imaging station, an exposure curing station, and an exemplary plate transport system as described herein.
Figure 2:
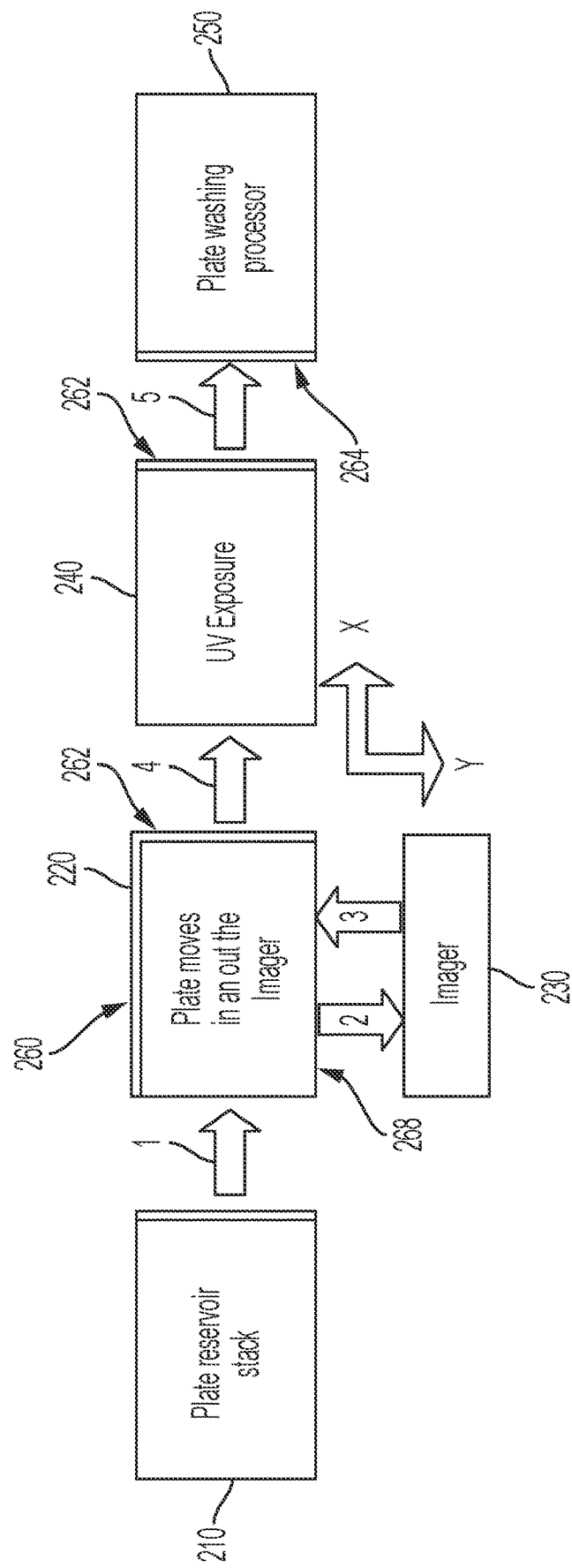
FIG. 2 is a schematic drawing depicting an exemplary plate at various stations of travel in an exemplary plate processing workflow, and the direction of movement of the plate between adjacent stations.

Movement of a plate through an exemplary plate processing workflow is depicted in FIG. 2, which also depicts the overall plate movement schematically. FIG. 1B depicts an exemplary physical layout of a portion of the exemplary workflow. The plate is first, optionally, taken from a location 210 in a plate reservoir stack or plate pickup area (e.g. table 212) and moved in the direction of arrow 1 to a marked staging location 220 (markings described herein later). From the staging location 220, the plate is moved into location 230 in the imager (which may be similar to imager 110 depicted in FIG. 1A) in the direction of arrow 2, and the plate is again disposed in the staging location 220 when it is discharged by the imager in the direction of arrow 3. The plate is then transported in the direction of arrow 4 to a location 240 in a photopolymer curing station, such as a UV exposure station (which may be similar to exposure unit 120 depicted in FIG. 1A), and then the plate is transported in the direction of arrow 5 to a next station, which may be a location 250 in a plate washing processor station, or a pre-washing loading area where the plate is punched and pins are placed therein for use in a transport system through the washing station.

Thus, the system as described herein may be used for executing each of the following process steps:
taking the non-processed plate from reservoir stack 210 in the direction of arrow 1;
feeding the plate into imager 230 in the direction of arrow 2;
removing the plate from the imager 230 in the direction of arrow 3;
feeding the plate to the UV exposure unit 240 in the direction of arrow 4; and
feeding the plate from the UV exposure unit 240 to the washing processor 250 in the direction of arrow 5.

In one embodiment, a row of vacuum gripper end effectors (i.e. suction cups), as are well known in the art, pick up the plate from the top surface of the plate adjacent edges that are aligned orthogonal to the movement direction. The thick black lines 260, 262, 264 in FIG. 2 indicate edges of the plate adjacent to the gripping areas on the surface of the plate where the suction cups pick up the plate, in an exemplary embodiment. Thus, for example, edge 260 is the trailing edge of the plate when moving in the direction of arrow 2 in the Y direction into the imager, and the leading edge of the plate when moving in the direction of arrow 3 in the −Y direction out of the imager. Likewise, edge 262 is the leading edge of the plate when moving in the direction of arrow 1 in the X direction from the plate reservoir stack in the location depicted in FIG. 2 and when moving in the direction of arrow 4 in the X direction from location 220 to the exposure unit 240.

Non-cured plates are sensitive to being damaged in the LAMS layer by the suction cups, which may warp the plate surface in a way that would stay in the plate surface and transfer into the print, if there is a mask opening in the LAMS layer at the same location of the warping, allowing the curing step to permanently fix the plate in the warped configuration. Thus, it is ideal to avoid image information in locations where the suction cups are applied, meaning the lifting area of the plate contacted by the suction cups should be as close as possible adjacent the relevant edge of the plate. To reduce the forces needed for the movement of the plate, compressed air is preferably blown between the lifted edge of the plate and the support surface, creating an air cushion, which reduces the friction between plate and support surface. The overall lift of the plate by the plate handling system is preferably minimal—enough to permit the air to blow beneath the plate to create the friction-reducing air cushion—but no more than is needed for this purpose. In general, a lifting distance in the Z direction on the order of 2 mm may be sufficient.

The geometry of the vacuum end effectors is not limited to any particular geometry, and may be, for example without limitation, round, square, rectangular, or nearly linear in nature. While round end effectors are depicted, the invention is not limited to any particular geometry, and other geometries (such as a rectangular geometry with the long edge parallel to the edge of the plate adjacent the pick-up area) may be used minimize the overall margin of non-imaged area required around the edge of the plate to provide non-imaged surfaces for interacting with the plate handler. Round end effectors are generally preferred, however, because forces are more evenly distributed for round end effectors, particularly at the edge of the end effector adjacent the edge of the plate from which the plate is grabbed. For example, the holding forces when moving the plate in the y-direction using a rectangular effector are different at the edge of the effector parallel to edge 260 of the plate than at the edge of the effector parallel to edge 262. When the relatively longer side of a rectangular end effector is aligned parallel to the plate edge, grabbing the plate at side 260 provides less holding force for the y-movement than grabbing from side 262. Although four vacuum end effectors are depicted in the figures, the invention is not limited to any number of end effectors. In exemplary embodiments configured for lifting plates having dimensions of 50×80 and 35×48 inches, respectively, it was found that four circular end effectors having a diameter of less than 1 inch, such as ½ inch diameter, evenly spaced in a linear configuration over a distance of 20 to 25 inches, provided adequate lifting characteristics. It should be understood that the embodiments as described herein are not limited to use for any particular size plates, and may be suitable for use in connection with any size of plates known, including but not limited to other standard sizes, such as 42×60 and 25×30 inch sizes, or portions thereof.

Accurate orientation of the plate relative to the imager intake and relative to the punch that punches holes into the plate downstream of the exposure station (for transportation through the washing processor) is often important. If the plate is not angled at the preferred orientation in the punching step (which punches from the top surface to the bottom surface of the plate adjacent trailing edge 262 of the plate), plate material may only incompletely surround the holes (and pins later inserted in the holes), and thus the plate may not be sufficiently fixed to the pins. The punching step is typically performed at a punching station located adjacent an entrance to the plate washing processor. Thus, it is preferred to align the relevant plate edge precisely parallel to the row of pins that punch holes into the plate at this step. Likewise, a drum imager is configured to receive the plate and grab the leading edge 268 of the plate using a clamp. The imaging step benefits from precise alignment of the leading edge in the clamp, so that the imaged information is properly aligned on the plate.

Thus, an optimal plate handling system is capable of positioning the plate and the suction cups very precisely, preferably within 1 mm of tolerance. As shown in FIG. 2, the handling system moves the plate in two directions (X, Y) along a plane defined by the staging location 220 for moving the plate into and out of the imager and the flat bed of the exposure unit. Because both alignment of the edge 268 first received by the imager and the edge 262 first received by the washing station, alignment parallel to both the X and Y axes may be critical. To facilitate parallel alignment of the relevant edges of the plate with both axes, the plate handling unit has another degree of freedom.

Figure 4B:
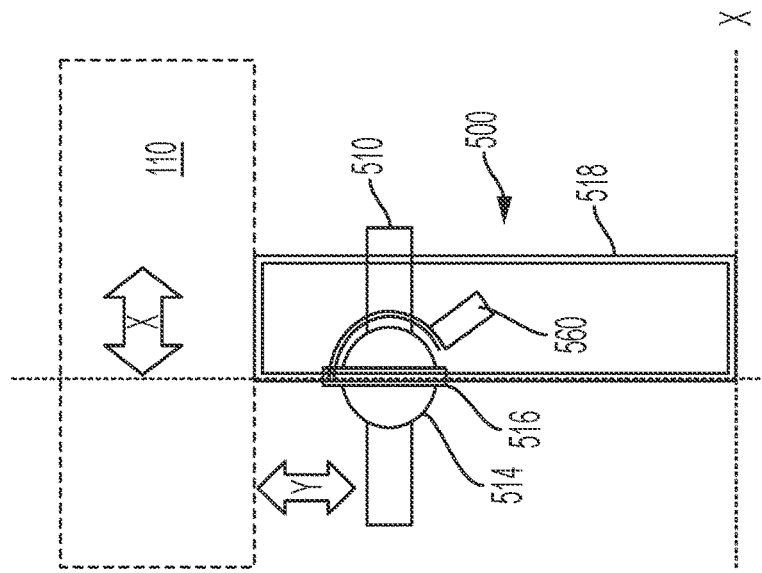
FIG. 4B is a schematic drawing that depicts a plan view of selected portions of the exemplary plate handler of FIG. 4A.
Figure 4A:
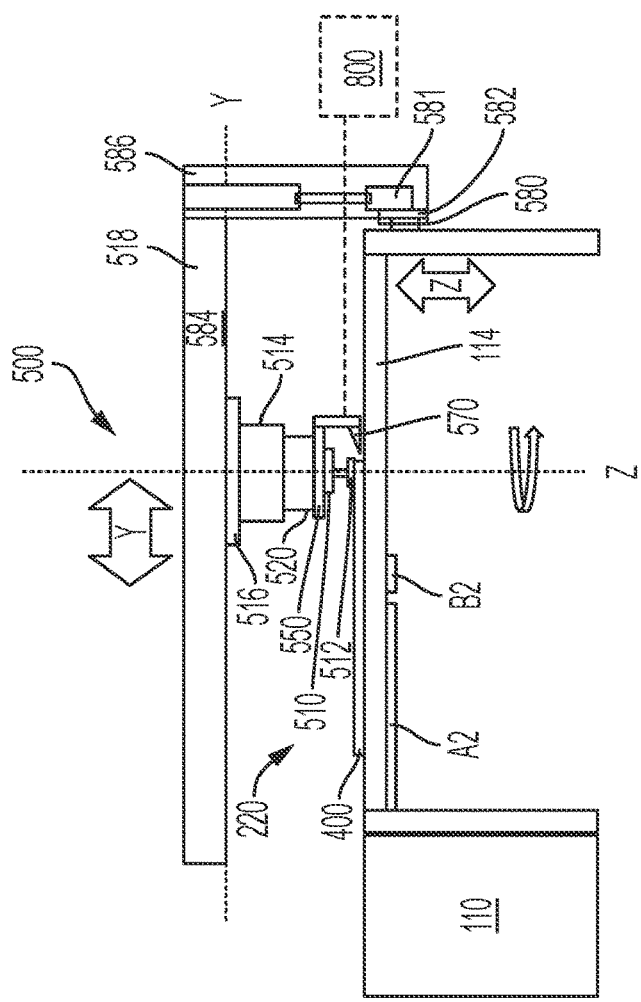
FIG. 4A is a schematic drawing that depicts an end view of an exemplary plate handler at an exemplary position in a workflow, viewed from the exposure unit looking toward the imager.
Figure 4C:
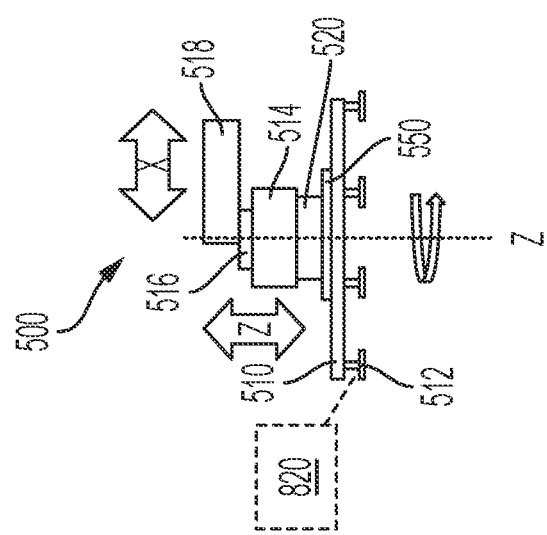
FIG. 4C is a schematic drawing that depicts an end view of selected portions of the exemplary plate handler of FIG. 4A, viewed from the imager.
Figure 4D:
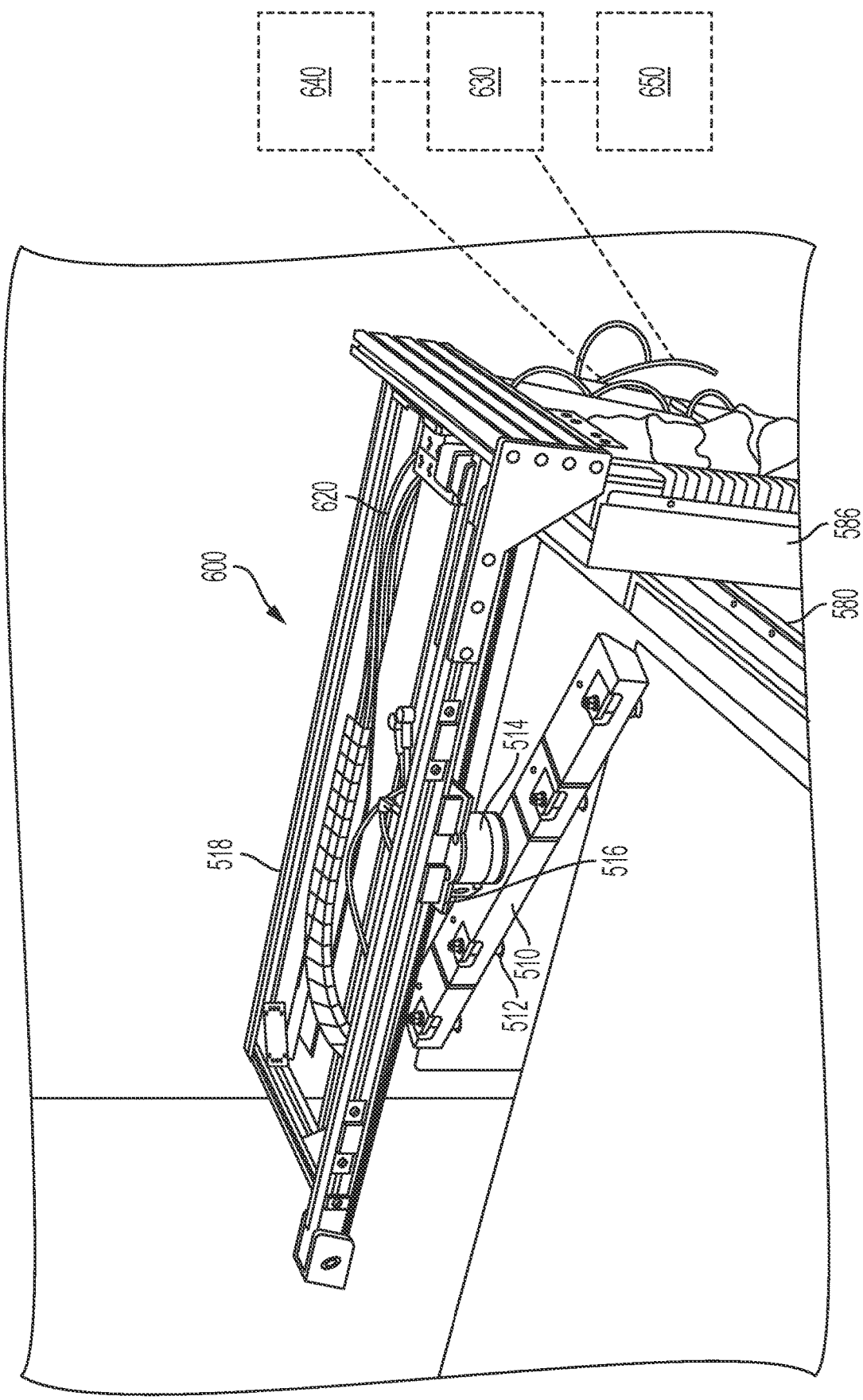
FIG. 4D is a photograph showing a perspective view of an exemplary prototype plate handler.
Figure 4E:
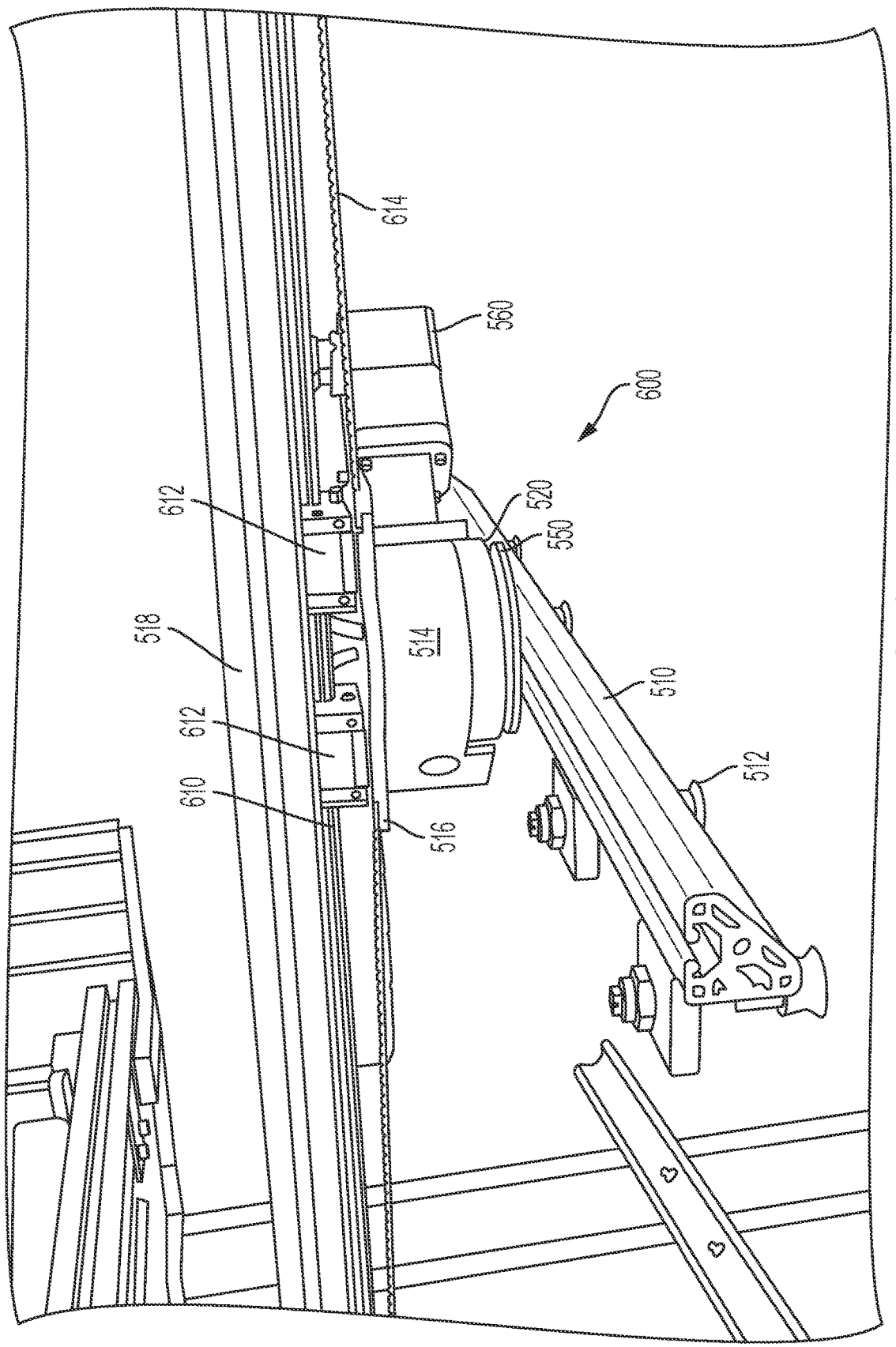
FIG. 4E is a photograph showing a close-up view of selected portions of the exemplary prototype plate handler of FIG. 4D.

Exemplary plate handler embodiments 500 and 600 are depicted in FIGS. 4A-4F. FIGS. 4A-4C are schematic drawings that depict an exemplary embodiment, not drawn to scale, showing various components of an exemplary system as described herein. Some elements are shown in all figures, whereas other elements are omitted in some figures to reduce clutter. FIGS. 4D-4F are photographs of an exemplary prototype embodiment 600, showing one of many ways in which various aspects of the invention may be reduced to practice. Common elements between FIGS. 4A-4F are given the same element numbers, but it should be understood that the schematic features shown in FIGS. 4A-4C may be embodied in any number of ways, and not necessarily as depicted in prototype 600.

As shown in the exemplary embodiments, a bar 510 with a row of vacuum end effectors 512 (suction cups) is mounted to a motorized rotation stage 514. Vacuum end effectors 512 are connected to a source 820 of vacuum, optionally controlled via a control valve (not shown), for controlling the state of the end effectors as pulling a vacuum or not pulling a vacuum. Vacuum end effectors and control thereof are well known in the art and specific designs are not detailed further herein. Rotation stage 514 is mounted on a Y linear stage 516 configured to provide movement in the Y direction, carriage 518 travels along the X-direction, and may also be configured to move up and down in the Z direction. Rotation stage 514 may also provide Z translation functionality to lower the bar with the suction cups down to the plate and then lift the plate up in the Z direction in some embodiments. Rotation stage 514 may, for example, comprise a bar mounting plate 550 to which bar 510 is connected. In one embodiment, bar mounting plate 550 may be connected to a translatable and rotatable hub 520 capable of translating in the Z direction and also rotating about the Z-axis. In the embodiment depicted in FIGS. 4D-4F, hub 520 may be configured only for rotation along the Z-axis. Z translation may be effected by a Z-translation stage 581 disposed vertically between carriage 582, which is configured to run on rails 580 extending across the workflow portion covered by the transporter, and the cantilevered portion 584 of carriage 518, as depicted in FIG. 4F. The Z-stage may be disposed within an enclosure 586, which may also house any of the control system drivers, solenoids, relays, processors (or portions of processing systems), and wiring connecting various components of the plate handling system.

As described above, precise positioning of the suction cups on the plate is desirable for multiple reasons, and therefore it is also desirable to determine the location of the plate edges precisely. In an exemplary embodiment, a sensor interacting the markings in staging location 220 measures location of the plate edge relative to four locations, as further described with reference to FIG. 3. In comparison to FIG. 2, FIG. 3 schematically depicts a plan view of a plate 400 in staging location 220, oriented with edge 268 facing the top of the page in FIG. 3.

In a preferred embodiment, one or more contrast sensors 560 (shown in FIGS. 4B and 4E, but omitted in other figures to reduce clutter), each configured detect a change in reflectivity between the plate and markings in the staging location are used for determining location. In the exemplary embodiment, a plurality of reflector strips A1, A2, B1, B2 are affixed to the underside of a transparent or translucent support surface, such as the glass support surface 114 depicted in FIG. 1B. Suitable contrast sensors include, for example, a Wenglor Laser contrast sensor, part number YM24PAH2ABF. The invention is not limited to any particular type of sensor, type of contrast sensor, or wavelength of operation. However, because the contrast sensor typically sends out radiation, such as in the form of a focused laser beam at a specific wavelength or band of wavelengths, and measures the amount of reflected light, the wavelength and intensity of radiation used by the sensor is optimally selected so as not to cause curing of the photopolymer or ablation of the LAMS layer.

The invention is not limited to embodiments with transparent or translucent support surfaces in some or all portions of the workflow. The use of opaque support surfaces may provide certain advantages, such as being able to use contrast sensors that can directly detect the difference between an opaque support surface and the polymer plate without using stripes marked on the support surface, as described herein.

Figure 3:
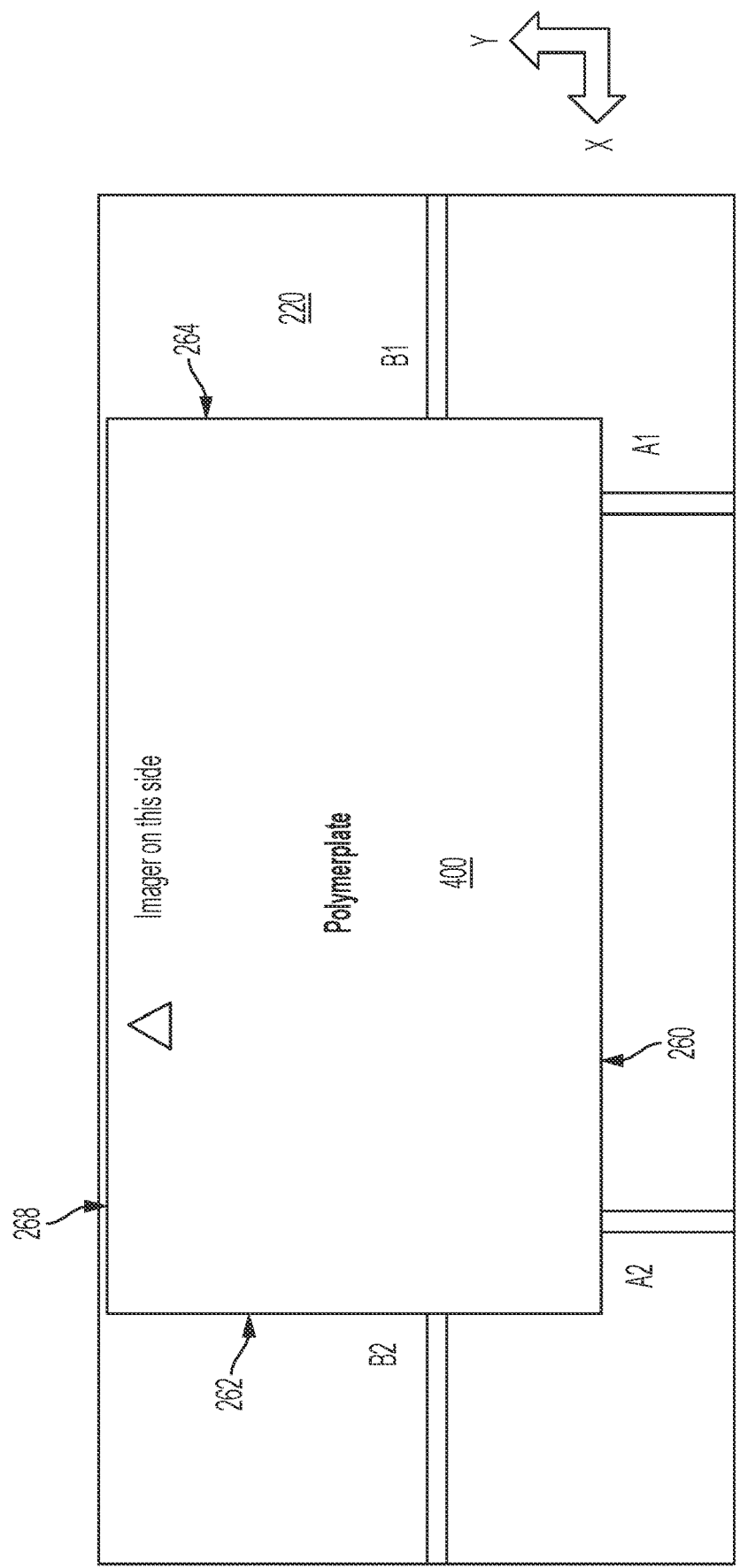
FIG. 3 is a schematic drawing depicting an exemplary plate positioned over exemplary markings in a staging area.

Lines A1, B1, A2, and B2 in FIG. 3 comprise exemplary markings for the contrast measurement. In embodiments in which the support surface is made of glass or other material that is transparent to radiation range of the sensor, the stripes may be attached to the bottom side of the support surface. The sensor is preferably connected to the plate handler in a way that is fixed relative to the Y linear stage 516 so that it is moveable in the X and Y axis with the other elements of the plate handler, but does not rotate or translate along the Z axis, as schematically depicted in FIG. 4B. Parallelism of the plate is measured with respect to the X-direction by scanning stripes A1 and A2 (e.g. if A1 is greater in length than A2, then some adjustment is needed). Scanning stripes B1 and B2 provides information regarding the location of the beginning and end of the plate in the transportation direction (X). Stripes B1 and B2 may be a continuous stripe with no gap between portions B1 and B2, or each of B1 and B2 may terminate in locations where any size plate for which the systems is designed would be expected to block the unstriped portion. A1 and A2 may similarly terminate near the expected edge 268 of the plate, or in a central location where any size plate for which the system is designed would block any unstriped portions. In an exemplary embodiment, scanning may be performed in the order: A1, B1, A2, B2.

In one embodiment, the plate may be placed on staging location 220 by an operator or by a prior step of the present plate handling system (or some other plate handling system). The contrast sensor 560 scans the plate relative to the four locations, calculates adjustments required to orient the plate relative to the stripes, picks up the plate, and rotates and translates the plate, as required. In one embodiment, the orientation of the plate is performed by grabbing the plate in the gripping area adjacent edge 260 and adjusting plate location. This adjustment step may be performed before moving the plate into a plate receiving position relative to the imager, to ensure the plate is engaged in a proper orientation by the clamp on the imager drum. In embodiments in which, for example, the plate is loaded by a human operator into the imager, or in which orientation in the imager is not as critical as orientation in the punching step upstream of the washing station, orientation adjustment prior to loading the plate into the imager may not be necessary. A plate orientation adjustment step may instead, or additionally, be performed when the plate is discharged from the imager, preferably before the plate is completely pulled out of the imager. Exemplary imagers are capable of unloading the plate to the support surface of staging area 220 automatically, but cannot fully push the plate onto the support surface, which requires the plate handling system to pull the plate a certain distance away from the imager (in the −Y direction as depicted by arrow 3 in FIG. 2). Thus, just before picking up the plate, the plate handler can assess orientation of the plate relative to the markings, adjust the position of the suction cups accordingly, based on the orientation of the plate, pick up the plate, and align the plate precisely prior to dropping the plate from the gripping area adjacent edge 260, and again picking up the plate adjacent edge 262 for movement in the X direction. In still another embodiment, the orientation step may additionally or instead be performed by the plate handler between the steps of pulling it from the imager adjacent edge 260 and picking it up again from edge 262.

In some embodiments, the imager loading, imaging, and discharging process may be sufficiently reliable such that a single orientation step prior to loading into the imager may be sufficient. However, in preferred embodiments, the plate handling system uses the sensor to detect the edge 260 of the plate relative to stripes A1 and A2 before grabbing the plate with the end effectors to pull it from the imager. This edge detection information provides sufficient information to adjust parallelism of the plate relative to A1 and A2, so the system can perform any necessary rotation before dropping the plate adjacent edge 260 or after picking up the plate adjacent edge 262. The sensor may also be used for sensing the location of edge 262 relative to B2 in order to place the end effectors in the correct location prior to lifting the plate for transporting it to the curing station. The sensor may be used prior to each picking step to ensure the end of the plate is in the expected location, or the handling system may rely upon stored information for gripping area locations, based upon expected (or measured) size of the plate and locations previously measured in process.

An exemplary orientation of the exemplary plate handler relative to an imager 110 having a glass support surface 114 that serves as staging area 220 for orienting plates going into and/or coming out of the imager, is depicted in FIGS. 1B, 2 and 3. Markings in the form of stripes A2 and B2 of reflective tape are affixed to the underside of glass 114. Air blade 570, connected to a pressurized air source 800 via various conduits (not shown) and controlled by one or more valves (also not shown), is shown positioned adjacent the vacuum end effectors 512 and pointed so that air is blown in a direction underneath plate 400 from a location on the other side of the vacuum end effectors from the plate. The operation of air blades and the control thereof are well known in the art and are not detailed further herein, except with respect to one exemplary, non-limiting embodiment. Air blade 570 is connected to the plate handling system in a fixed configuration relative to bar 510 (as shown, fixed to bar mounting plate 550), so that the air blade remains in a fixed location relative to the vacuum end effectors. In a preferred embodiment, the vacuum end effectors move in the Z direction in a fixed relationship with the air blade, with the air blade disposed in a location and at an angle at which it directs air at the interface of the plate and a surface on which the plate rests, for a known plate thickness. The relationship between the air blade and the vacuum end effectors may also be adjustable for different plate thickness. The air blade rotates with mounting plate 550 and bar 510 so that it is always directed from "behind" the end effectors relative to the plate. Rotation stage 514 thus rotates hub 520 so that the air blade is in the desired position regardless of whether the plate handler is pushing or pulling the plate. Although systems with an air blade are preferable to reduce the friction of the plate sliding on the surface and thus the gripping force needed to be exerted by the suction cups, embodiments without an air blade may also be provided. The air blade is not shown schematically in the other figures, to reduce clutter.

Figure 6B:
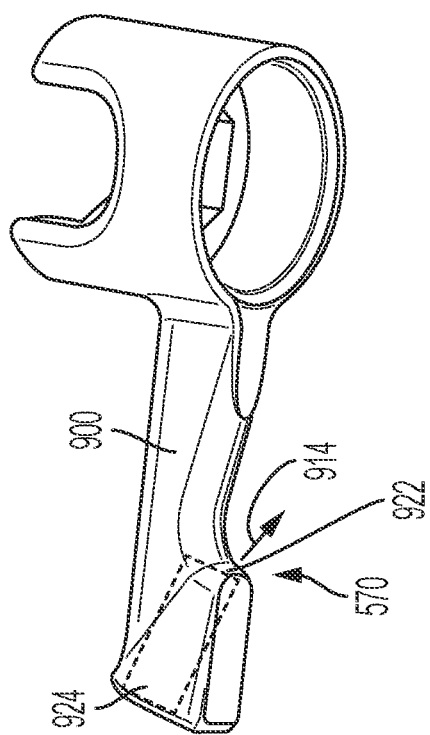
FIG. 6B is a schematic diagram depicting a perspective view of an exemplary air blade/vacuum end effector fitting depicted in FIG. 6A, from a view beneath and from an opposite side shown in FIG. 6A.
Figure 6C:
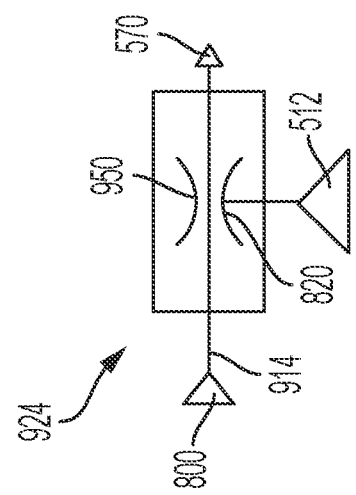
FIG. 6C is a schematic diagram depicting the internal venturi in the exemplary air blade/vacuum end effector fitting of FIGS. 6A and 6B.

In some embodiments, depicted in FIGS. 6A-6C, each vacuum end effector 512 may be connected to bar 510 via a fitting 900, which fitting also serves as air blade 570. Thus, the air blade nozzles are directly connected to the end effectors and move with them in a fixed relationship. The air blades are aligned such that they direct air into the gap between the polymer plate and the support surface, after the polymer plate has been lifted. In preferred embodiments, air is directed through the air blade before the polymer plate is moved in the x or y direction. Air hose 910 connects to fitting 900, such as via elbow connector 912, and is connected to air supply 800 (depicted schematically in FIGS. 4A and 6C), preferably via a common manifold (not shown) to which the hoses connected to the respective air blades connect. Air blade 570 may comprise outlet 922 in fitting 900, which may be the outlet of a venturi nozzle 924 in communication with air hose 910. Air blade 570 is configured to direct air 914 toward the area between bottom of the plate 400 and the surface on which the plate rests 114 when the vacuum end effector is in contact with the plate. In the embodiment depicted, air 914 moving through the narrow portion 950 of venturi 924 nozzle causes the venturi effect that pulls air into the nozzle through the connected end effectors 512, thus creating a vacuum at the end effectors. It should be understood that the embodiment of air blade 570 depicted in FIGS. 6A-6C is only one embodiment having many alternatives. In other embodiments, fitting 900 may be connected via a vacuum hose (not shown) to a vacuum source that is not integrated with the air blade fitting, such as a vacuum pump. Various systems for providing vacuum and air, in either integrated or separate systems, including manifolds, conduits, connectors, and the like are known, and embodiments of the invention may comprise any such systems known in the art without limitation, which systems are not detailed herein further.

As depicted in FIG. 4A, carriage 518 is preferably cantilevered from one side of the processing workflow, running on rails 580 that extend a necessary distance between the stations of the workflow (e.g. 210, 220, 240 and 250 as depicted in FIG. 2). A cantilevered design obviates any need for a vertical support that would interfere with plate transit along arrows 2 and 3 (as depicted in FIG. 2) in the Y direction between the imager 230 and the staging area 220. Thus, with reference to the exemplary system of FIG. 1B, rails 580 are located on the on the side of the staging surface 114 opposite slit 112 of the imager 230.

The prototype 600 depicted in FIGS. 4D-4F also shows an exemplary mechanism for moving the Y linear stage 516 along the Y-axis. As shown best in FIG. 4E, Y linear stage 516 comprises a pair of rollers 610 that run on rails 612 of carriage 518, and are moved along the rails 612 by a tooth belt 614 operated by a stepper motor (not shown), as is known in the art in connection with linear positioner systems, and is configured to precisely position the Y linear stage in a desired position. Likewise, carriage 518 may comprise linear positioner configured to precisely position the stage in a desired position along rails 580, which in the embodiment depicted in FIGS. 4D-4F may be in the form of a toothed rack that interfaces with a toothed gear driven by a stepper motor (not shown). The invention is not limited to any particular embodiments for causing movements in the various directions with the desired degrees of freedom, precision, and repeatability, as many alternatives for providing equivalent operability are well known in the art.

Figure 5:
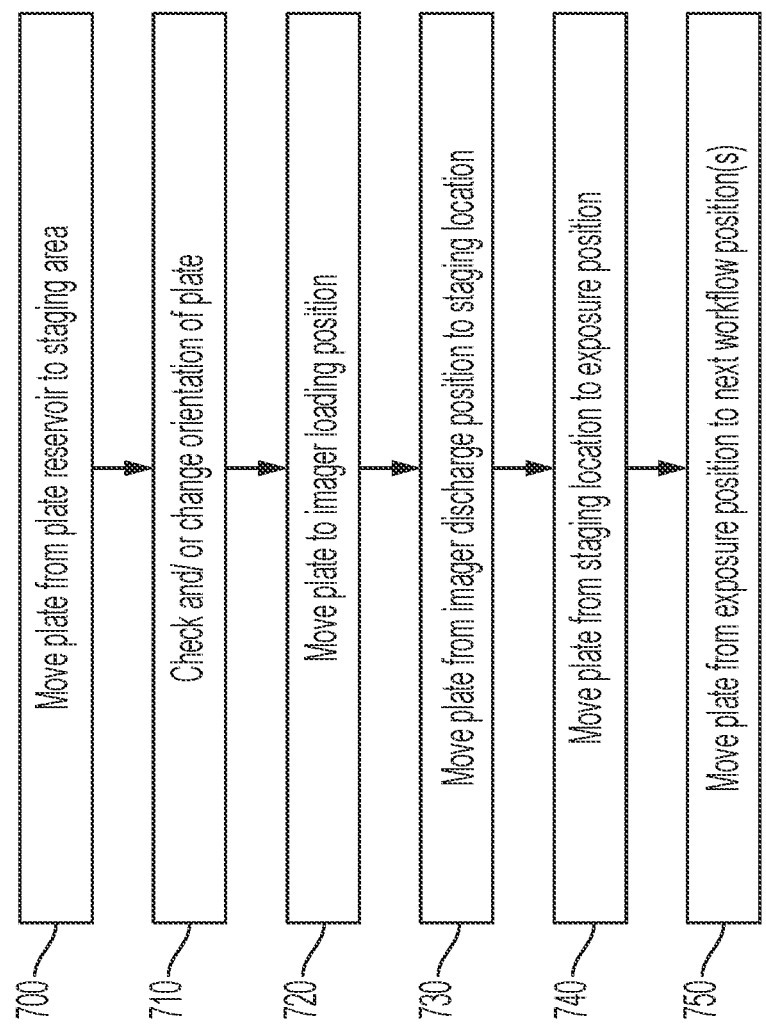
FIG. 5 is a flowchart of exemplary plate handling system functions in an exemplary workflow.

As depicted in FIGS. 4D and 4F, the various components of the system may be connected via various wires 620 (or wirelessly) to a control system 630, which is connected to a power source 640, along with any electrically powered components of the plate handling system. Some or all of the power to the plate handling system may be run through the control system, and some portions of the system may be directly powered by the power source, with the controller causing instructions to be sent to various switches, relays, and the like that control the various functions of the moving parts. Control system 630 may comprise one or more computer processers of any type known in the art, and may comprise components locally mounted at the physical location of the process workflow stations as well as components remotely located and connected via wires or wirelessly to components located locally with the workflow stations. The processor is connected to the various drivers of the system components as described herein, and is programmed with machine-readable instructions residing in a computer memory, for causing the various functions as described herein. A user interface 650 (such as a touchscreen like 140, 142 depicted in FIG. 1B) may permit a human operator to select various functions of the system to be performed. The process may be fully automated to minimize the need for operator attention in at least some modes of operation, although interactions between a human operator and the computer process may be desired to trigger each function in other modes of operation (such as in a mode for servicing the equipment). In an exemplary user interface, a menu of options listing the various functions of which the system is capable may be displayed on the display of the human operator, and the operator may be able to use a touch screen of the display interactively to select which function to trigger. Alternatively, the user may be able to select an automated mode by which the system interacts with the various other portions of the workflow in a coordinated fashion automatically. For example, in the system as described herein, the method steps and programmed functions for using the plate handling system may include, as depicted in the flowchart of FIG. 5:

a) moving (e.g. pulling) a plate from the plate reservoir to the imager staging area in step 700;

b) checking and/or correcting orientation of a plate relative to sensed markings in the imager staging area in step 710;

c) moving (e.g. pushing) a plate to a loading position of the imager in step 720;

d) moving (e.g. pulling) the plate from the imager to the staging area in step 730;

e) moving (e.g. pulling) the plate from the staging area to an exposure position on the exposure unit in step 740; and f) moving (e.g. pushing) the plate from the exposure position on the exposure unit to next position in the workflow in step 750.

The next position in the workflow may be any operation known in the art, but in exemplary processes, the next location may include a punching station wherein the holes for inserting the pins for the plate transport system of the plate are punched. The pins are then inserted in the holes and fastened to the plate in the manner known in the art, and the washing station transport system may then move the plates using the pins in subsequent steps. In embodiments in which the punching station and the pin loading station are not co-located, the plate handling system as described herein may be used for moving the plate from the punching station to the pin loading station, and may retain a grip on the plate until the pins have been inserted and fastened.

It should be understood that the system may be capable of handling multiple plates at different portions of the workflow simultaneously, meaning that while the steps 700-750 as depicted in FIG. 5 may be sequentially performed for each plate, the system itself may perform the steps out of order for a plurality of plates. For example, the system may perform each of steps 700, 710, 720, 730, and 740 for a first plate, and then perform steps 700, 710 and 720 for a second plate. At some point after completion of the exposure step for the first plate, the plate handling system may then perform step 750 for the first plate, at which time the system is available to perform step 740 for the second plate. Step 730 may be performed for the second plate at any time after performance of steps 700, 710 and 720 for the second plate and performance of step 740 for the first plate. After performance of step 740 for the second plate, the workflow has vacancy to permit the plate handler to perform steps 700, 710, 720, and 730 for a third plate.

The controller may be configured to store the last location of each plate and the user interface may display the schematic location of each plate in the system and the next step for selection by a human operator. The user interface may be programmed to disable performance of any steps not cleared to be performed because of a blocking plate in the workflow. For example, if a first plate is in the imager, the controller may disable performance of steps 700, 710, and 720 for a second plate, until step 730 has been conducted for the first plate (or until the user selects and override function indicating that the first plate has otherwise been cleared). While systems may be fully automated for operation without the involvement of a human operator, using various sensors and communications among process stations to administer performance of the method steps, typical workflows will include interactions with a human operator to trigger performance of each step in the process.

The system may also be capable of performing other steps not discussed herein, such as moving a plate to a cutting station. The system may also permit the operator to initiate performance of plate orientation correction step 710 at any point in the workflow when the plate is in the staging area. Although described primarily with a marked staging area at a location adjacent the imager, it should be understood that marked staging locations for correcting orientation of the plate may be at other locations in a workflow. Step 710 reflects checking and/or for changing the orientation of the plate, because the sensor may detect that the plate is perfectly oriented and not correction or change in orientation is required. This may be particularly true in embodiments in which an orientation step is performed prior to loading a plate into the imager, in which the imager does not disturb the original plate orientation. The system may be configured to rest in a neutral resting location when not actively moving a plate, and to return to that neutral resting location immediately after depositing a plate in an instructed location, absent a command to move to some other location. The neutral resting location may comprise any location that does not interfere with any of the other moving parts of the workflow. For example, the neutral resting location is ideally located so that the plate handler does not interfere with the range of travel of the moving parts of the UV exposure system and beyond the range of travel of a plate being discharged from the imager. The resting location may be a variable location and may be anticipated by the controller to be a location closest to the next position the plate handler expects to be instructed to go, based on preprogrammed instructions or by machine learning.

Finally, although depicted in the figures in a particular embodiment comprising various linear and rotational stages to provide the minimum number of degrees of freedom required for the exemplary configuration shown, it should be understood that other configurations for providing the desired movements may be devised using any combination of components known in the art, including combinations with more degrees of freedom. For example, instead of system comprising linear and rotational stages as shown having geometrically limited ranges of travel and only four degrees of freedom, a robotic arm having six degrees of freedom may be provided with suitable end effectors to provide the desired range of motion. Any system providing the range of functions required may be suitable for use as a plate handling system.

Although described herein in some embodiments as pulling (lifting from a leading edge of the plate in motion) or pushing (lifting from the trailing edge of the plate in motion) the plate, it should be understood that pulling may be substituted for pushing, or vice versa, for some steps (e.g. step 740). Other steps (e.g. step 720, in the configuration as depicted with the carriage 518 cantilevered from the side of the staging area opposite the imager input) may require a specific type of movement (pushing). Furthermore, while the relative locations described herein for the imager, the exposure unit, the plate reservoir are preferred relative locations, it should be understood that the invention is not limited to any particular configuration.

Plate reservoir as described herein may be location where individual plates are deposited by the human operator for pick up by the system, or may be a reservoir configured to hold multiple plates in a stack. In one exemplary stacked system, as described in U.S. Pat. No. 6,981,447, titled "METHOD AND APPARATUS FOR LOADING AND UNLOADING FLEXOGRAPHIC PLATES FOR COMPUTER-TO-PLATE IMAGING," incorporated herein by reference, the system comprises a support surface that is movable in the Z direction and configured to position the next plate in the stack on the same plane as the rest of the stations in the process workflow. Such functionality minimizes the overall range of travel required in the Z direction for the Z translation component of the plate handler. It should also be noted that some workflows may not use the plate handler for performing step 700 at all, and may rely on the human operator to place the plate on the staging area.

Mobile Preparation Table or Carriage

In flexographic plate production an operator typically feeds polymer plates to the plate processing system. The plate processing system usually starts with the plate imager followed by a UV-curing unit and a plate processor to remove non-cured polymer. Whenever the imager has completed imaging a plate, the plate is typically moved to the next process step (such as with the transport system described elsewhere herein) and the operator supplies the next plate to be imaged. While the plate transportation system as described herein is configured to automatically move the plate from the imager to the UV-curing station, supplying the system with new ready-to-image plates is generally beyond the scope of cost-effective automation. Typically, a vast variety of different plates types and plate thicknesses are stored in a plate storage room physically separated from the plate processing room. The plate type to be imaged frequently changes from job-to-job, so a human operator typically is tasked with supplying the next plate from storage to the imager.

The time the imager waits for the next plate reduces the overall efficiency of the equipment, and therefore, having the next plate ready exactly when imager has delivered the prior imaged plate to the UV curing unit and is ready to image the next plate can provide optimization advantages. Prioritizing this task may reduce flexibility of the operator to perform other tasks.

Sometimes operators mistakenly deliver a wrong plates to the imager. If this mistake is not recognized until the plate is already on the printing press, it reduces efficiency and adds cost. Often, such mistakes are recognized in a Quality Assurance (QA) step before moving the fully-processed plate to the press, causing additional costs in the nature of plate waste and wasted production capacity. Thus, improvements to plate supplying systems and methods provide human operators more flexibility for other tasks, minimizes idle time of the processing equipment, and reduces the likelihood of operator mistakes.

One way to provide such improvements is to integrate the transport table into the plate workflow, such that the table becomes a component of the plate processing system consisting of imager, UV exposure and plate washing unit. Embodiments of the plate handling system as described herein may therefore benefit from interaction with a plate loading table or carriage configured for transport of flexographic polymer printing plates and for connection mechanically and electrically to the system.

Figure 7A:
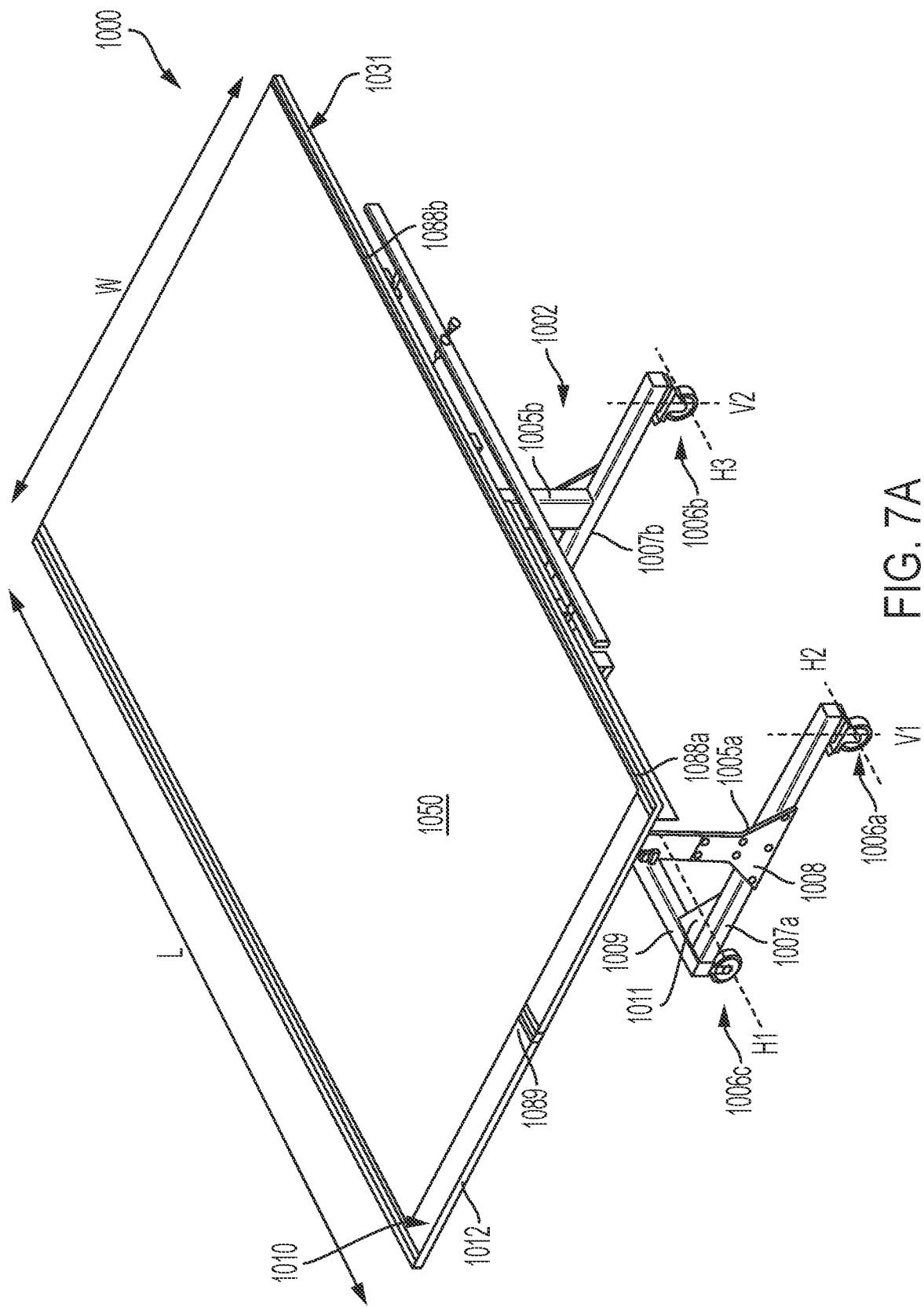
FIG. 7A is a schematic perspective top view diagram of an exemplary plate transport carriage.
Figure 7B:
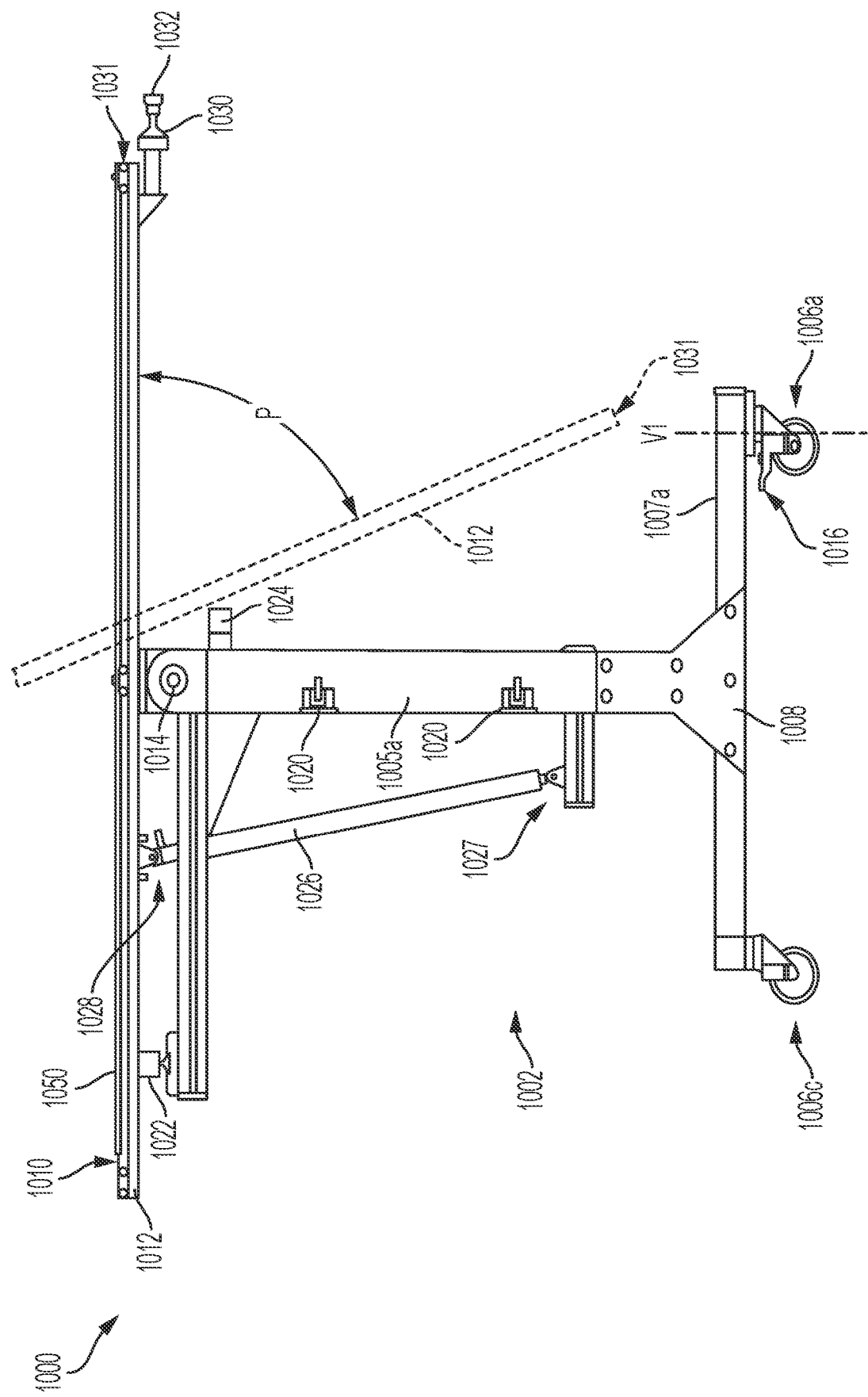
FIG. 7B is a schematic side view diagram of the exemplary plate transport carriage of FIG. 7A.
Figure 8:
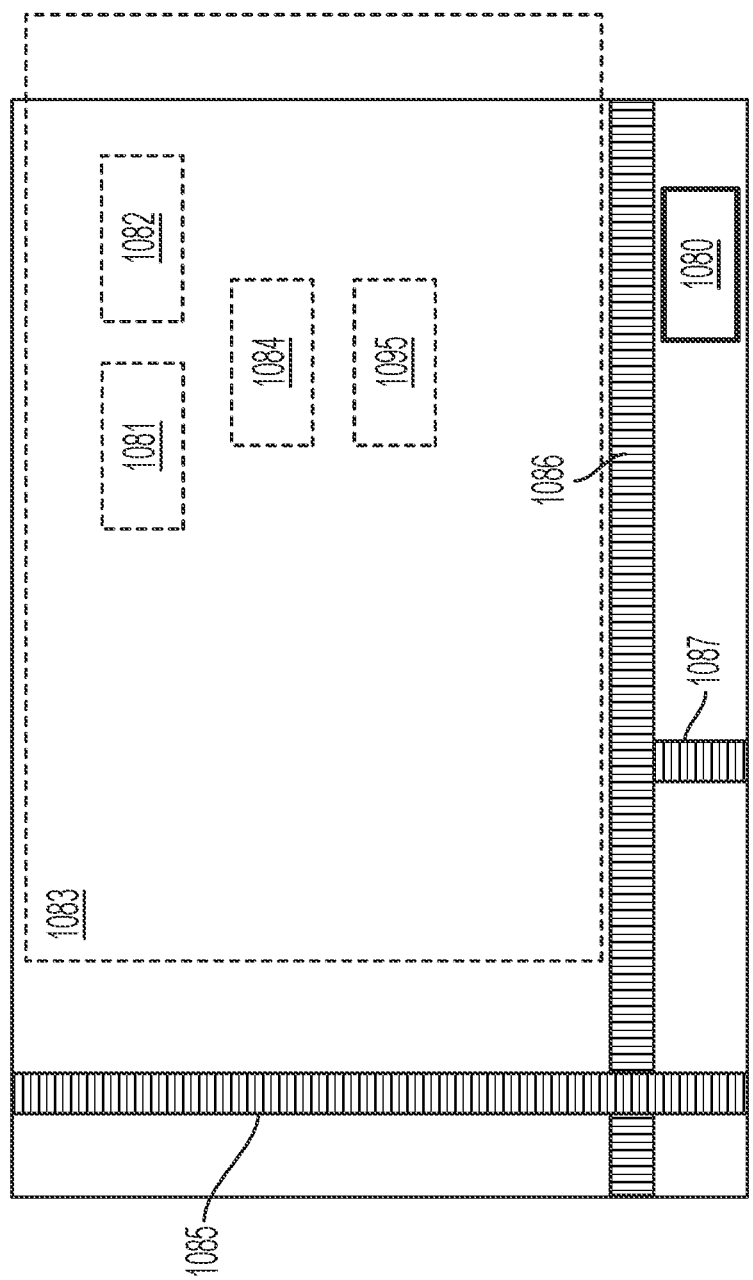
FIG. 8 is a schematic plan view diagram of an exemplary plate preparation surface of the plate transport carriage of FIG. 7A.

An exemplary mobile preparation table or carriage 1000 ("platform", "staging area," "table" and "carriage" may be used interchangeably herein) for transporting printing plates to and from an interface with plate processing equipment is depicted in FIGS. 7A-7B. Various exemplary features are also depicted in FIGS. 8-10. An exemplary interface with plate processing equipment is depicted in FIG. 1C.

Carriage 1000 comprises a base 1002 having a frame and a plurality of wheels 1006a, 1006b, 1006c, (fourth wheel not visible in the drawings) attached to the frame and configured to roll along a floor surface. In the embodiment depicted in FIGS. 7A and 7B, the frame includes two vertical risers 1005 each attached to a horizontal wheel frame 1007, with opposite wheel frames connected to one another by a cross-brace 1009. Bracket 1008 connects each vertical riser 1005a, 1005b to a corresponding wheel frame 1007a, 1007b, and brackets 1111 strengthen the connection between each wheel frame and cross-brace 1009. Planar preparation surface 1010 for receiving plate 1050 includes a top frame 1012 pivotally attached to the vertical risers 1005 of the base frame via hinge 1014 (e.g. a barrel hinge mechanism), which is configured to facilitate pivoting of the planar preparation surface frame 1012 within a range of angles along arrow P between a first, horizontal position in which the plate preparation surface is parallel to the floor surface (depicted in solid lines in FIG. 7B) and a second maximum tilt position (depicted in dashed lines, with top portion cut off) in which the plate preparation surface is disposed at an acute angle relative to the first position.

One or more physical connection interfaces 1020 are configured to secure the base mechanically in a fixed position relative to the plate processing equipment. Physical connection interfaces 1020 may comprise locks that affix the position of the table when docked to the imager loading area. The locks may operate mechanically, electrically, magnetically, or a combination thereof. Such connection interfaces may be present on one or both sides, but in particular, are present at least on any side expected to abut the processing equipment (such as on the right side of the carriage in FIG. 1C). When not docked to the plate processing system, the table is configured to transport flexographic printing plates between a plate storage room and the plate processing system. The table is configured to tilt from horizontal to an upright or nearly upright position to fit through narrow doors. Additional functions such as integrated plate size measurement, discussed further herein, and means for cutting may also be provided.

Figure 1C:
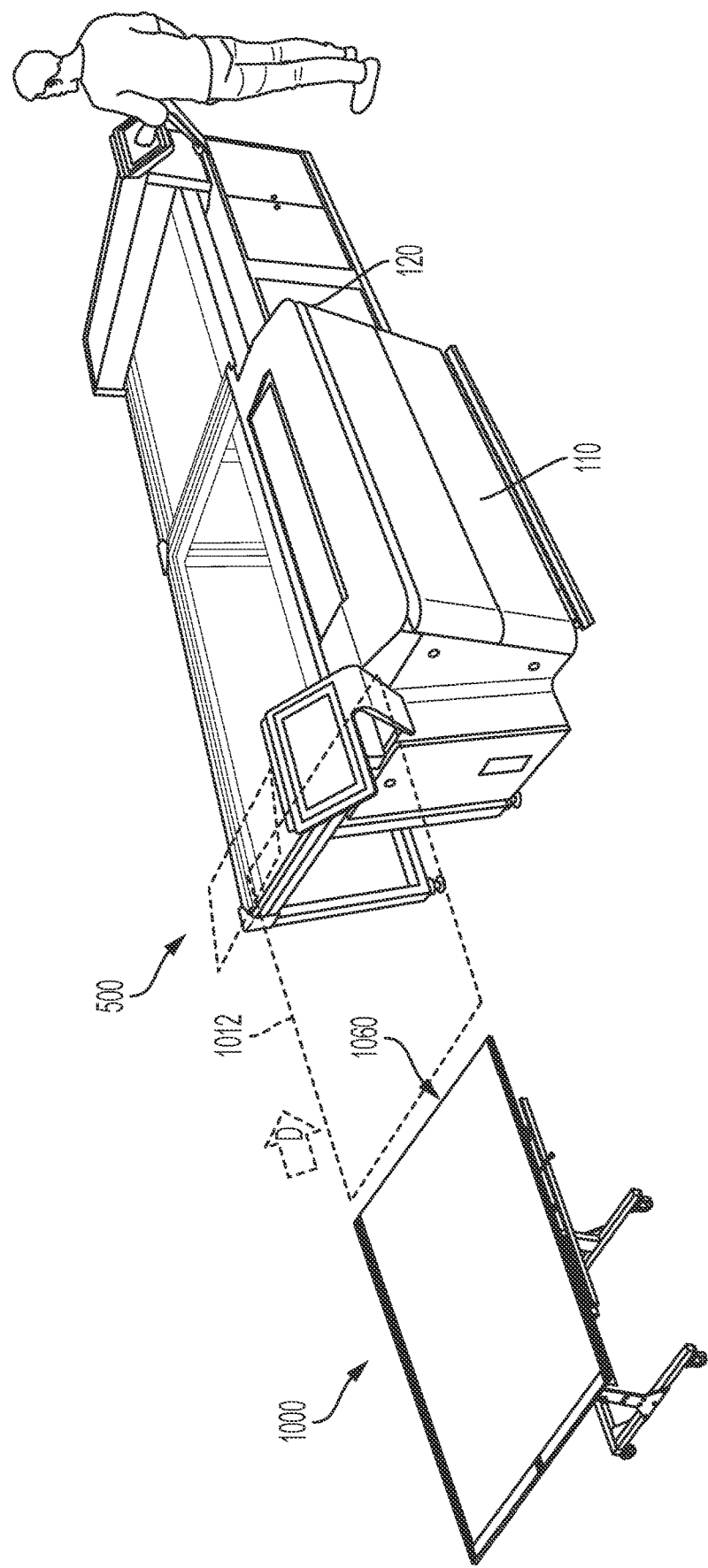
FIG. 1C is a depiction of an exemplary interface with plate processing equipment.

In the embodiment depicted in FIG. 1C, a side portion 1060 of the carriage tabletop is configured to overlap the loading area of the imager on the side abutting the imager 110 to allow the automatic plate handler 500 to pick the plate and pull it completely on to the loading area of the imager. In another embodiment, the tabletop does not overlap and is in proximity to the edge of the loading table, with the height of the tabletop higher (e.g. a few millimeters) than the loading table. While the carriage as described herein may be used with processing systems with or without plate handling systems as described herein, when used in conjunction with systems having an automatic plate handler as described above, the processing systems are configured so the plate handler can reach the edge of a plate positioned in a ready position on the carriage. For example, whereas the layout in FIG. 1B shows the plate handler 500 running on a rail 580 that extends the length of fixed table 212, the layout in FIG. 1C for use with a moveable carriage 1000, may have a rail that ends at or adjacent the edge of the imager. In another embodiment, the interface between the table and the processing system may be oriented so that a freestanding portion of the rail extends to provide a reach of the plate handler across the full range of the carriage, with the geometry of the carriage and its physical connections configured so that the carriage can be wheeled into a fixed position relative to the rail and the imager. Carriage 1000 is configured to be moved to the docked location along dashed arrow D to a docked position (dashed lines), wherein it is physically held in place by mechanical connections 1020 (disposed on the opposite side of the base than the side depicted in FIG. 7B).

One or more of the plurality of wheels comprises a stop mechanism 1016 for arresting rotation of the wheel. A first pair of the plurality of wheels (e.g. wheel 1006c and the wheel (not shown) attached in the corresponding position to wheel frame 1007b), may be fixed to the frame in an orientation in which each wheel is configured to rotate about a first common horizontal axis H1 parallel to the floor. A second pair of the plurality of wheels (e.g. wheels 1006a, 1006b) may be pivotally attached to the frame in orientations in which each wheel is configured to rotate about a independent horizontal axis H2, H3 parallel to the floor and free to pivot about a second axis V1, V2 perpendicular to the floor.

The table as depicted in FIGS. 7A, 7B includes a mechanism for moving the planar preparation surface between the horizontal position and the maximum tilt position. A first mechanical stop 1022 is positioned to restrict pivoting of the planar preparation surface beyond the range of angles when the top is in the horizontal position, and a second mechanical stop 1024 is configured to restrict pivoting of the planar preparation surface beyond the range of angles when the top is in the maximum tilt position. Each stop may comprise a member attached to the preparation surface frame 1012, to the base 1002, or a combination thereof. The stop preferably comprises a robust, cushioned member (e.g. real or synthetic rubber). A spring-damper member (e.g. a gas spring) 1026 has a first end 1027 connected to the base frame and a second end 1028 connected to the planar preparation surface frame. A handle 1030 connected to the planar preparation surface frame 1012 adjacent a front edge 1031 of the surface 1010 of is configured to permit a human user to manipulate the planar preparation surface between the horizontal position and tilted positions without a need for the user to contact the frame 1012. An actuator (knob 1032) has a first configuration (e.g. pushed in) for retaining the planar preparation surface from pivoting and a second configuration (e.g. pulled out) for releasing the planar preparation surface to permit pivoting.

In the exemplary carriage depicted in the figures, the planar preparation surface frame has a rectangular shape with a relatively longer length dimension L than width dimension W, and has a size to accommodate the largest plate the system is configured to process. The front edge of the planar preparation surface frame 1031 has a length that defines the length dimension. The handle 1030 comprises a parallel member connected to, spaced laterally from, and centered relative to edge 1031 and has a length at least half the length of the first edge.

In one embodiment, actuator 1032 has an actuated position, and a resting position, and is connected to a first end of a Bowden cable (not shown) connected to a valve (not shown) in gas spring 1026. With the actuator in the actuated position, the gas valve opens, allowing gas to enter or exit the chamber of the gas spring in accordance with movement of the table. In the resting position, the valve is closed, stabilizing the position of the gas spring and the table in the corresponding position. The general mechanical functions of gas springs, valves thereon, and Bowden cables are well known to those of skill in the art, and are therefore not discussed or illustrated in more detail herein.

The carriage may comprise a sensor system including sensors for detecting one or more of presence, actual and/or intended alignment, dimensions (including thickness), and weight of the plate on the table. The table may be equipped with a microcontroller configured to process information from the sensors, calculate measurements, and communicate with connected components, including providing viewable information on the display and exchanging information with the processing system. A battery (such as a lithium ion or other rechargeable battery) may be provided for providing power to the microcontroller and the other electronic components of the carriage. The rechargeable battery may be configured for charging by a wired or wireless connection, such as with electrical power connections established when the table is docked to processing equipment.

In some embodiments, the carriage may be configured as light-table, thereby permitting a human operator to check images on the plate and the overall plate quality. In such embodiments, the tabletop is made of a transparent material, such as glass or a synthetic organic resin, such as a Plexiglas® sheet. The rear side of the plate, or at least a portion thereof, is illuminated by a light source (e.g. an OLED or a LED matrix 1083, shown schematically in FIG. 8). The light source may cover the complete table surface or only a portion of the table surface. As depicted in FIG. 8, the table preferably includes at least one detection sensor 1085, 1086, 1087 configured to detect a plate positioned on the preparation surface and configured to provide an electrical signal output indicative of such detection. A plurality of alignment guides include at least one alignment guide 1088a, 1088b adjacent a front edge 1031 of the frame, and at least one alignment guide adjacent 1089 a second dimension of the frame perpendicular to the first dimension. Each alignment guide 1088a, 1088b, 1089 may have an extended projection relative to the planar preparation surface in a position configured to align with an edge of a printing plate disposed on the planar preparation surface. This extended projection of front alignment guides 1088a,b may have a height above the preparation surface of at least a thickness of an expected printing plate, but in any event have a height sufficient to help keep the plate from slipping downward off the preparation surface when the table is in a maximum tilt position.

The plate dimensions may be measured automatically using sensors 1085, 1086, 1087. Sensors 1085, 1086, 1087 may comprise arrays of photo detectors, such as solar cells or photodiodes. Sensor arrays 1085, 1086 are arranged orthogonally in perpendicular directions (1085 in the width direction, and 1086 in the length direction). When disposed on the table, plate 1050 covers portions of the photodetector arrays, and the lack of ambient light received by the covered photo detectors relative to light received by the uncovered detectors provides information used by the processor to calculate the plate length and width dimensions. Accordingly, aligning the plate parallel to the photo detector array respective to the table edge may be important for obtaining a correct measurement. Indicia on the table may include a stripe defining a line for aligning to one edge of the plate, or the alignment guides 1088a, 1088b, 1089 may provide correct alignment if the respective edges of the plate are in contact with the respective portions of those guides that project above the plate preparation surface. A third photo detector array 1087 in combination with photo detector arrays 1085, 1086 may be used for checking alignment parallel to the table edge. In another embodiment, a single photo element may be provided to detect that one edge of the plate is positioned properly in the corner of the table surface, while the detector arrays check the plates edge is positioned as close to the table edge as the plate corner. In still another embodiment, mechanical sensors (e.g. alignment guides 1088a and 1088b having a contact sensor) may detect the presence of a correct aligned plate. The sensors as described above are connected to a processor 1084 for calculating characteristics of the plate based upon measurement signals from the sensors.

The table is preferably configured with a communication port for data exchange with the processing system. This communication port is preferably wireless, but may be a wired connection that is engaged at the same time as the physical connection interface 2020 that affixes the carriage to the imager. One or more communication interfaces 1081 are configured to exchange information between the table and the plate processing equipment. One or more of the physical connection interfaces 1020 may also include an electrical connection to provide charging power to the table, which may have an onboard rechargeable power source 1082, such as a battery. Communication interface 1081 and power source 1082 are depicted in dashed lines in FIG. 8 indicating that they are located somewhere on the carriage, but not necessarily in any particular position or in a position visible to users of the table.

When in communication with the processing system, the communication interface 1081 is configured to provide information to the system regarding the plate disposed thereon. In one embodiment, information about the next plate ready for processing and positions the plate ready for processing when the loading table is docked to the imager, thus providing the operator who brings the plate to the processing system a wider time window to place the plate next to the processing system. Without interaction between table and processing system, the operator typically has to watch for the exact moment when the system is ready to load the next plate and supply the plate at this exact moment in order to keep delay times short.

Exemplary information exchanged by the carriage to the processing system, may include, inter alia, plate type, dimensions (length, width, thickness), weight, and alignment of the plate (e.g. relative or absolute coordinate information) on the tabletop. Information exchanged by the processing system to the table, may include required plate type and dimensions. A display may provide information for the operator regarding the next plate to pick from storage for delivery to the processing system. In one embodiment, display 1080, such as an LED, LCD or TFT display, is placed beneath a transparent surface of the table top. In another embodiment (not shown), the display may be located on the operator handling side of the table adjacent the operator handle. This display may provide information to the user including dimensions (including thickness) of the plate on the table, specifications for the next plate to be supplied for imaging, time remaining until the imager needs the next plate, and whether the plate detected on the table corresponds to the plate expected next in the process.

Communication to the processing system may be established by any wireless or wired technology known in the art. For example, communication may include wireless communication over a network, such as over a wireless local area network (WLAN), such as a WiFi® network, or over a short-range wireless connection, such as a Bluetooth® network. In other embodiments, wireless communications may be transmitted via infrared radiation, such as are commonly used for remote controls for audiovisual equipment. In embodiments in which the topography of the wireless network permits, the carriage may have a continuous data link to the processing system. In other embodiments, including wired connections, the data link may be only temporary, such as when the table is docked to the processing system. Regardless of communication protocol, the data exchanged preferably contains information about the plate disposed on the table and the next plate to be delivered from plate storage.

In the embodiment depicted in FIG. 8, the carriage is configured to automatically determine a size of the plate disposed thereon. In another embodiment, the plate dimensions may be measured by the operator relative to indicia adjacent the table top (e.g. rulers) (not shown) and manually entered using a user interface (such as a keyboard or mobile device) connected to the processor.

Thickness Measurement Systems

The preparation table may also be configured to determine the thickness of the polymer plate and to communicate this information to the processing units and to the operator. In one embodiment, the thickness can be measured by a standard triangulation sensor 1090 located above the tabletop pointing towards the polymer plate, as illustrated in FIG. 9A. Sensor 1090 may be any type of non-contact sensor, such as a time of flight sensor that transmits a beam 1091 (or pulses) of radiation toward surface 1092 and determines distances based upon time for reflected radiation to reach the sensor. Thus, as depicted in FIG. 9A, a first distance is measured between the sensor and the surface 1092 in a first reading. A second distance is measured between the sensor and a plate 1093 in a second reading. The difference in distance between the first and second readings corresponds to the thickness of the plate.

The thickness measurement system may disposed on a positioner to move the sensor between the first and second readings, or sensor 1090 may be located in a place where the plate moves underneath the sensor relative to the surface. In one embodiment, sensor 1090 is mounted on the plate handling system 500. In another, the thickness measurement system may be disposed in the plate storage room where the plate thickness is confirmed after loading on the table. In still another embodiment, the thickness measurement system may be disposed in a fixed location along the path of the plate, such as inside the imager in the plate loading path. Thus, such a system can be characterized as a system for measuring thickness of a printing plate relative to a surface 1092 for receiving a printing plate 1093, comprising a non-contact distance measurement sensor 1090 configured to output a measurement signal indicative of distance along an axis perpendicular to the surface. In an embodiment where the sensor is moveable, the system further comprises a sensor positioner (e.g. plate handler 500) disposed above the surface and controllable in one or more directions parallel to the surface, and a processor 1084 configured to control the positioner and to receive a measurement signal from the sensor. In some embodiments, the processor may be programmed with instructions for:

(a) receiving information defining an expected location of the plate;

(b) moving the positioner to a first position disposed above a point on the surface not above the expected location of the plate (e.g. left position of sensor 1090 depicted in FIG. 9A);

(c) obtaining a reference distance measurement signal from the sensor for use as a reference distance between the sensor and the surface;

(d) moving the positioner to a second position disposed above a point on the surface above the expected location of the printing plate (e.g. right position of sensor 1090 depicted in FIG. 9A);

(e) obtaining a second distance measurement signal from the sensor, and processing the second distance measurement signal and the reference distance measurement signal to obtain the measured thickness of the printing plate.

In another thickness measurement embodiment, depicted in FIG. 10, the triangulation sensor may be located below the transparent table top as depicted in FIG. 10. Light source 110 sends a light beam 1102 through the transparent portion of the table top (e.g. glass plate) 1104, the dimensional stable layer 1106, and the polymer layer 1108 towards the laserablate able mask 1110 of the polymer plate 1112. Each transition of the beam from one medium to the next causes a light reflection (1120, 1121, 1122). The reflected light rays hit a lateral sensor 1130, such as an array of photo detectors. While reflection 1120 from the transition between the table substrate 1104 and the dimensionally stable layer 1106, and reflection 1121 from the transition between the dimensionally stable layer 1106 and the photopolymer 1108, both hit fixed positions on the sensor 1130 (assuming a standard dimensionally stable layer thickness), reflection 1122 from the transition between photopolymer 1108 and the laser ablateable mask 1110 changes its position depending on the thickness of the polymer layer, thus indicating the thickness of the plate. In the alternative, the distance between reflection 1120 and 1122 may be used to measure the overall thickness of the combination of the dimensionally stable layer and the photopolymer. Although the dimensional stable layer and polymer have a different index of refraction that may cause inaccuracies, the sensor has sufficient performance to distinguish between plate standard gauges (e.g. 1.14 mm, 1.7 mm, 2.84 mm, 3.19 mm), which are typically different enough to absorb a relatively high level of imprecision.

In another embodiment the table may have one or more integrated scales 1095 disposed between the table frame and the table top that measures the additional weight of the photopolymer plate. This weight, in combination with the plate length and width dimensions, may be used for calculating the plate thickness.

The thickness measurement systems as disclosed herein are not limited for use in connection with the plate preparation table or a plate handling system having the details as discussed herein, and may be used in any system for measuring thickness relative to a surface on which a plate is disposed or location of a surface of a component relative to the distance sensor.

Figure 11:
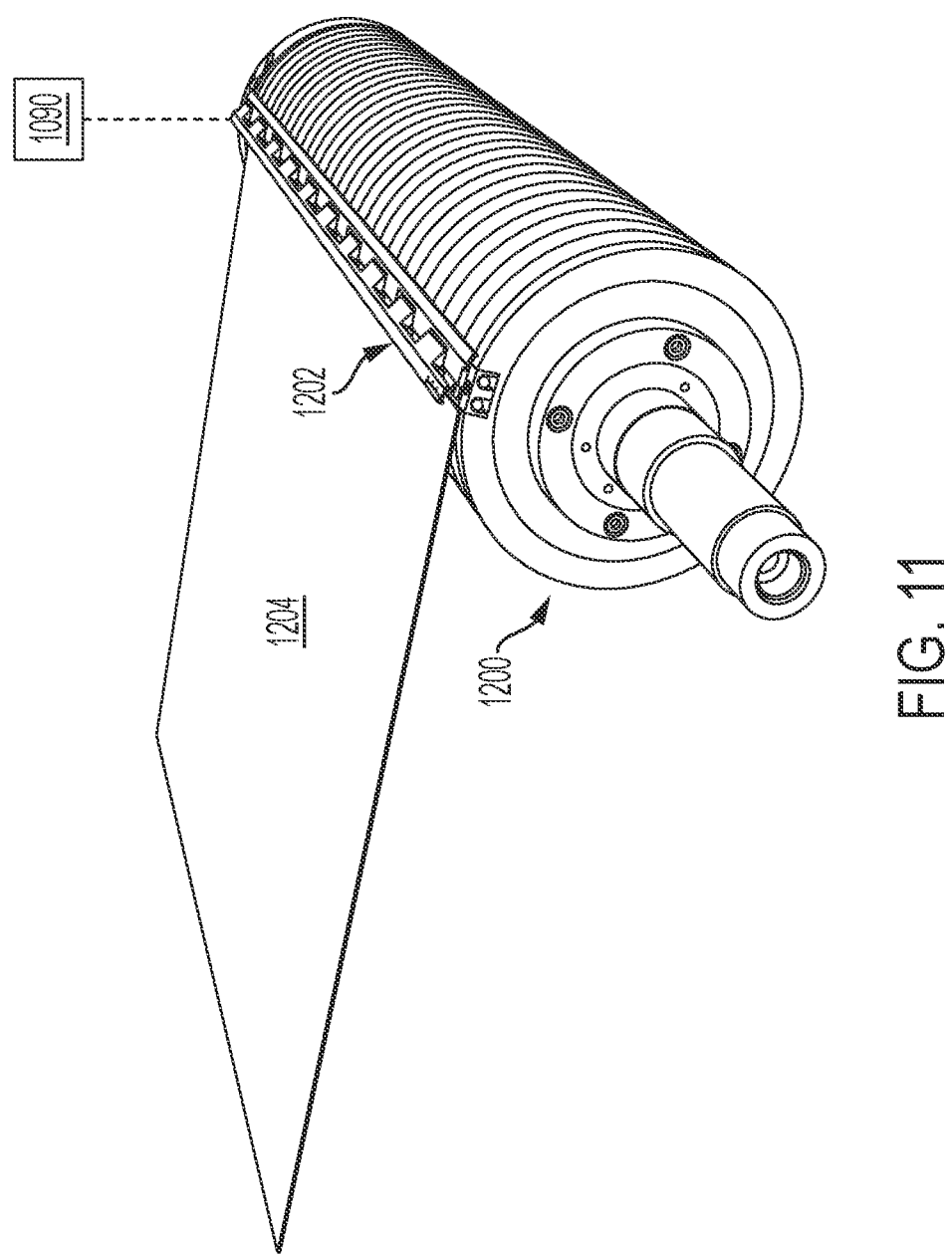
FIG. 11 is a schematic diagram depicting a plate thickness sensor/distance sensor for controlling/calibrating a clamping bar of a drum imager.

For example, a thickness sensor such as the system shown in FIG. 9A, may be incorporated into the focusing head of the imager, such as for detecting plate thickness and the open position of the clamp on the drum imager for securing the plate. As schematically shown in FIG. 11, a drum imager includes a drum 1200 with an exemplary clamping bar 1202 that has an open position (as shown in FIG. 11) for receiving the plate, and a closed position (not shown). The bar is typically moved by compressed air, wherein the open position is controlled by the opening time of an air valve (not shown). Distance sensor 1090, positioned, e.g. on the focusing head of the imager, may be positioned relative to the plate 1204, to measure the height of the top surface of the plate relative to the sensor location, which is an indication of plate thickness. The measured thickness may then be used for determining how far the clamping bar should be opened. The distance sensor may also be used for calibrating the valve that controls the compressed air for opening the valve, by measuring height of the top surface of the clamping bar 1202 versus open time of the valve, to create a suitable curve or lookup table. While FIG. 11 depicts the drum in a position with the clamping bar 1202 located beneath sensor 1090, it should be understood that with the drum rotated in a different position, the plate may be located beneath the sensor, without the sensor needing to be moveable in the direction of plate feeding to read plate thickness. It should also be understood that the arrangement and clamp configuration depicted in FIG. 11 is exemplary only, and that thickness sensing may be used in conjunction with any number of different designs.

Figure 9B:
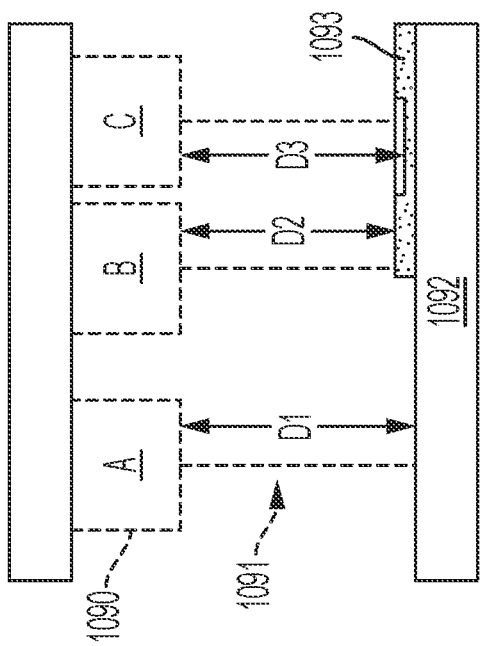
FIG. 9B is a schematic diagram depicting the exemplary plate thickness detection system of FIG. 9A employed for measuring encoded information in a plate using thickness.
Figure 9A:
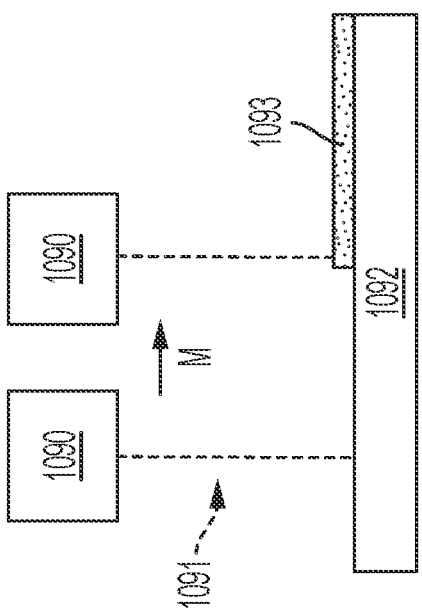
FIG. 9A is a schematic diagram depicting an exemplary plate thickness detection system.
Figure 10:
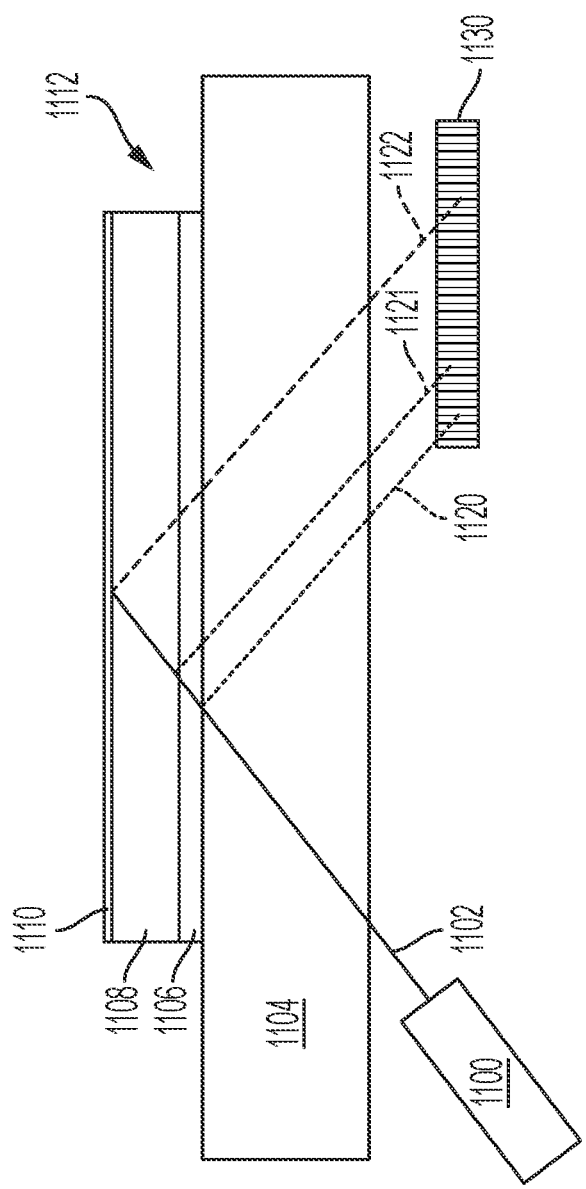
FIG. 10 is a schematic diagram depicting an exemplary plate thickness detection system.

Additionally, systems similar to those depicted in FIGS. 9A and 9B may have uses in other ways relevant to the plate handling system. For example, a thickness measurement system mounted to the plate handler 500 (or on a different positioner) may be used for detecting location of the plate, as well as thickness, in any of plate locations as described herein. Such a system may detect an actual position and angle of the plate on a surface, if the processor is programmed with instructions for:

(f) detecting a change in signal received from the sensor while the positioner is in motion from the first position to the second position indicative of a location of a first edge of the plate;

(g) detecting a change in signal received from the sensor while the positioner is in motion between at least two other pairs of points, each pair including one point above the expected location of the printing plate and one point not above the expected location of the printing plate, and detecting respective changes in signals received from the sensor while the positioner is in motion between each pair of points, each change indicative of locations of second and third edges of the plate;

(h) processing the signals indicative of the locations of the first, second, and third edges of the plate to obtain a detected actual position and angle of the plate on the surface.

In one embodiment, the sensor may be a laser triangulation sensor and the positioner may comprise a 3-axis robotic arm. The measurement signal may be an analog signal or a digital signal.

A thickness measurement system as described herein may also be used in conjunction with plate coding systems for embedding non-printing indicia on a floor of the plate using areas of presence and absence of polymer in the plate floor, such as is described in, inter alia, U.S. application Ser. No. 16/559,702, titled SYSTEM AND PROCESS FOR PERSISTENT MARKING OF FLEXO PLATES AND PLATES MARKED THEREWITH, and applications related thereto, incorporated herein by reference. In implementations in which the plate includes information encoded as differences in plate thickness along a predetermined path as depicted in FIG. 9B, the system may be further programmed with instructions for moving the sensor 1090 along the predetermined path while receiving measurement signals, and processing the measurement signals so received to read the encoded information. Thus, for a path in which sensor 1090 takes a reading at point A, point B, and point C as depicted in FIG. 9B, the difference between the distance D1 at point A and distance D2 at point B is indicative of the presence or absence of the plate (and transitions in signal from D1 to D2 may be used for determining location of plate edges). The difference between the distance D2 at point B and D3 at point C may be indicative of a thickness difference comprising non-printing indicia (where D3 is a distance above or below the floor of the plate that does not correspond to a distance that results in a printed feature). Of course, the thickness measurement system may also be used for detecting a distance associated with the floor of the plate.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A plate handling system for transporting printing plates between workstations in a process workflow, the system comprising:
   a plurality of vacuum gripper end effectors configured to grip the printing plates and mounted to a computer controlled transporter, the transporter configured to translate in at least three orthogonal directions and to rotate about at least one rotational axis;
   at least one sensor for detecting orientation of the plate relative to at least one staging location in the process workflow; and
   a controller, connected to the transporter and the at least one sensor, configured to cause the transporter to move based upon programmed instructions in accordance with information provided by the sensor;
   wherein the transporter comprises a carriage configured to translate in an X direction, a Y linear stage connected to the carriage and configured to translate in a Y direction orthogonal to the X direction, a rotation stage connected to the Y linear stage and configured to rotate about a Z axis orthogonal to the X and Y directions, and a Z linear stage connected to the carriage and configured to translate along a Z direction orthogonal to the X and Y directions.

2. The plate handling system of claim 1, wherein the at least one sensor comprises a contrast sensor configured to detect a difference in reflection characteristics of an object at a given wavelength or range of wavelengths, and the at least one staging location comprises a planar surface comprising markings having reflection characteristics that differ from the reflection characteristics of the printing plate to a degree detectable by the contrast sensor.

3. The plate handling system of claim 2, wherein the markings define at least three stripes, including at least one first stripe oriented parallel to a first edge of the plate and positioned to intersect with opposite second and third edges of the plate orthogonal to the first edge, and at least two stripes oriented orthogonal to the at least one first stripe and configured to intersect with the first edge of the plate.

4. The plate handling system of claim 3, wherein the at least one first stripe oriented parallel to a first edge of the plate comprises two linearly aligned first stripes, each positioned to intersect with one of the second or third edges of the plate.

5. The plate handling system of claim 1, wherein the at least one staging location is a marked location comprising a support transparent or translucent to a detection wavelength of the sensor, the support having an upper surface for receiving the printing plate, and markings are disposed on an underside of the transparent or translucent support opposite the upper surface.

6. A plate handling system for transporting printing plates between workstations in a process workflow, the system comprising:
   a plurality of vacuum gripper end effectors configured to grip the printing plates and mounted to a computer controlled transporter, the transporter configured to translate in at least three orthogonal directions and to rotate about at least one rotational axis;
   at least one sensor for detecting orientation of the plate relative to at least one staging location in the process workflow; and
   a controller, connected to the transporter and the at least one sensor, configured to cause the transporter to move based upon programmed instructions in accordance with information provided by the sensor;
   wherein the end effectors are configured to grip the printing plate on an upper surface of the plate, the process workflow comprises an imaging station configured to apply an image to the upper surface of the plate, and a photopolymer curing station comprising a support transparent or translucent to an actinic radiation emitted by the photopolymer curing station, wherein the photopolymer curing station is configured to irradiate both the upper surface and an opposite lower surface of the plate.

7. The plate handling system of claim 6, further comprising an air blade configured to direct an air stream between the plate and a surface on which the plate is disposed.

8. The plate handling system of claim 7, wherein at least one of the plurality of end effectors includes a fitting comprising:
   the end effector connected to a source of vacuum, the vacuum end effector positioned to contact an upper surface of the printing plate; and
   the air blade connected to a source of air, the air blade configured to discharge an air stream beneath a lower surface of the plate in a configuration in which the vacuum end effector is in contact with the upper surface of the printing plate.

9. The plate handling system of claim 8, wherein the air blade and vacuum end effector have a fixed relationship relative to one another.

10. The plate handling system of claim 8, wherein the source of vacuum comprises a venturi nozzle having an air input connected to the source of air, an air output connected to the air blade, and a vacuum region connected to the vacuum end effector.

11. The plate handling system of claim 8, wherein the system is configured to lift, pull, and/or push the plates relative to a planar support surface with the end effector in contact with the upper surface of the plate and the air stream directed between the lower surface of the plate and the planar support surface.

12. A method of transporting polymer printing plates in a process workflow, the method comprising lifting, pulling, and/or pushing the plates relative to the planar surface using the plate handling system of claim 11, the method comprising pulling a vacuum through the end effector in contact with the upper surface of the plate while simultaneously discharging the air stream beneath the lower surface of the printing plate to reduce friction between the lower surface of the printing plate and the planar surface.

13. The plate handling system of claim 6, wherein the plate handling system is configured to detect, with the sensor, a first position of the plate relative to the staging location, calculate movements required to place the plate in a preferred position relative to the staging location, and cause the transporter to perform the calculated movements.

14. The plate handling system of claim 6, wherein the plate handling system is configured to grip the printing plate in one or more areas on an upper surface of the plate, lift the gripped area of the plate along a Z axis, rotate the plate about the Z axis, and push or pull the plate along an XY plane.

15. The plate handling system of claim 6, wherein the process workflow comprises a washing station.

16. The plate handling system of claim 15, wherein the plate handling system is programmed to perform one or more of the following operations:
    a) grip the printing plate in a first area of an upper surface of the plate, lift the first area of the plate, and push the plate into a plate loading position of imaging station;
    b) grip the printing plate in the first area of the upper surface of the plate, lift the first area of the plate, and pull the plate away from a plate discharge position of imaging station;
    c) grip the printing plate in a second area of the upper surface of the plate, lift the second area of the plate, and pull the plate onto the exposure station; and
    d) grip the printing plate in a third area of the upper surface of the plate, lift the third area of the plate, and push the plate to a pre-processing position for the washing station.

17. The plate handling system of claim 15, wherein the process workflow further comprises a plate reservoir station located sequentially before the imaging station.

18. The plate handling system of claim 17, wherein the plate reservoir station is configured to receive a single plate.

19. The plate handling system of claim 17, wherein the plate reservoir section is configured to receive a stack of plates.

20. The plate handling system of claim 17, wherein the plate handling system is programmed to grip an area of the printing plate, lift the gripped area of the plate, and move the plate from the plate reservoir station to the at least one staging location.

21. A non-transitory computer program product, readable by a machine, comprising instructions for operating the plate handling system of claim 6, the computer program product comprising instructions for:
    receiving information from the at least one sensor indicative of orientation of the plate relative to the at least one staging location;
        causing the plurality of vacuum gripper end effectors to selectively produce vacuum to provide a gripping function; and
    causing the transporter to translate in any of the at least three orthogonal directions and/or rotate about the at least one rotational axis in accordance with preprogrammed instructions and information provided by the sensor.

22. The plate handling system of claim 6, wherein the photopolymer curing station comprises a linear stage configured to provide the actinic radiation, the curing station linear stage have a resting location relatively nearer a trailing end of the curing station than to a leading end of the curing station, and the plate handling system is configured to pull the plate onto the curing station in a direction from the leading edge to the trailing edge, deposit the plate in a curing location, and return to a location that does not interfere with transit of the curing station linear stage.

23. The plate handling system of claim 22, wherein the plate handling system is configured to grab, lift, and push the plate from a trailing edge of the plate to move the plate from the curing location to a washing station receiving position in which at least a portion of the plate is located beneath the curing station linear stage in the resting position.

24. The plate handling system of claim 6, wherein the photopolymer curing station is configured to emit actinic UV radiation.

25. The plate handling system of claim 6, wherein the imaging system is a drum imaging system having a clamp for receiving a leading edge of the plate and the plate handling system is configured to grip an area of the upper surface of the plate adjacent a trailing edge of the plate and to push the plate into the imaging station until the leading edge of the plate is disposed in a clamp receiving position.

26. The plate handling system of claim 25, wherein the imaging system is configured to apply the image to the upper surface of the plate by ablating a LAMS layer of the plate to form a mask.

27. A method of processing a printing plate in a plurality of workstations in a process workflow, the method comprising the steps of:
    (a) providing a plate handling system for transporting the printing plate from one workstation to another in the process workflow, the plate handling system comprising a computer controlled transporter configured to translate in at least three orthogonal directions and to rotate about at least one rotational axis, end effectors for gripping the printing plates connected to the transporter, at least one sensor for detecting orientation of the plate relative to at least one staging location in the process workflow; and a process controller, the process controller connected to the transporter, to the at least one sensor, and to a computer processor;
    (b) sensing, with the at least one sensor, location and orientation of a plate to be transported; and
    (c) using the transporter, lifting the plate in a Z direction relative to an XY plane and one or more of: moving the plate in an X direction, moving the plate in a Y direction, and rotating the plate relative to a Z-axis;

wherein the at least one sensor comprises a contrast sensor configured to detect a difference in reflection characteristics of an object at a given wavelength or range of wavelengths, the at least one staging location comprises a planar surface having at least portions thereof having reflection characteristics that differ from the reflection characteristics of the printing plate to a degree detectable by the contrast sensor, and the method comprises the sensor detecting an edge of the plate relative to the planar surface of the staging location.

28. The method of claim 27, further comprising directing an air stream between the plate and a surface on which the plate is disposed when transporting the plate.

29. The method of claim 27, further comprising detecting, with the sensor, a first position of the plate relative to the staging location, calculating with the process controller processor, movements required to place the plate in a preferred position relative to the staging location, and performing the calculated movements with the transporter.

30. The method of claim 27, comprising gripping the printing plate with the plate handling system in one or more areas on an upper surface of the plate, lifting the gripped area of the plate along the Z axis, and pushing or pulling the plate along the XY plane.

31. The method of claim 27, wherein the printing plate comprises a photopolymer printing plate, and the process workflow comprises a plurality of sequential process stations comprising an imaging station, a photopolymer curing station, and a washing station.

32. The method of claim 31, comprising performing one or more of the following operations:

e) gripping the printing plate in a first area of an upper surface of the plate, lifting the first area of the plate, and pushing the plate into a plate loading position of the imaging station;

f) gripping the printing plate in the first area of the upper surface of the plate, lifting the first area of the plate, and pulling the plate away from a plate discharge position of the imaging station;

g) gripping the printing plate in a second area of the upper surface of the plate, lifting the second area of the plate, and pulling the plate onto the exposure station; and h) gripping the printing plate in a third area of the upper surface of the plate, lifting the third area of the plate, and pushing the plate to a pre-processing position for the washing station.

33. The method of claim 32, wherein the process workflow further comprises a plate reservoir station located sequentially before the imaging station.

34. The method of claim 32, wherein the plate reservoir station is configured to receive a single plate, and the method comprises a human operator placing the plate at the plate reservoir station.

35. The method of claim 32, wherein the plate reservoir station is configured to receive a plurality of plates, and the method comprises the plate reservoir station positioning a first plate in a ready position accessible to the transporter, the transporter handling the first plate and moving it away from the plate reservoir station, and the plate reservoir station positioning a second plate in the ready position prior to the transporter returning and handling the second plate.

36. The method of claim 32, further comprising gripping the printing plate in the third area of the upper surface of the plate, lifting the third area of the plate, and pulling the plate to the at least one staging location.

37. The method of claim 31, wherein the at least one staging location is located at an input of the imaging station.

38. The method of claim 27, wherein the at least one staging location comprises markings in the form of at least three stripes, including at least one first stripe oriented parallel to a first edge of the plate and positioned to intersect with opposite second and third edges of the plate orthogonal to the first edge, and at least two stripes oriented orthogonal to the at least one first stripe and configured to intersect with the first edge of the plate, and the method comprises the sensor detecting an edge of the plate relative to the detected stripes.

39. The method of claim 38, wherein the at least one staging location is a marked location comprising a support transparent or translucent to a detection wavelength of the sensor, the support having an upper surface for receiving the printing plate, and the markings are disposed on an underside of the transparent or translucent support opposite the upper surface.

40. The method of claim 27, wherein the workflow comprises a drum imaging system having a clamp for receiving a leading edge of the plate, the method comprising gripping an area of the upper surface of the plate adjacent a trailing edge of the plate with the plate handling system and pushing the plate into the imaging station until the leading edge of the plate is disposed in a clamp receiving position.

41. A plate handling system for transporting printing plates between workstations in a process workflow, the system comprising:

a plurality of vacuum gripper end effectors configured to grip the printing plates and mounted to a computer controlled transporter, the transporter configured to translate in at least three orthogonal directions and to rotate about at least one rotational axis;

at least one sensor for detecting orientation of the plate relative to at least one staging location in the process workflow;

a controller, connected to the transporter and the at least one sensor, configured to cause the transporter to move based upon programmed instructions in accordance with information provided by the sensor;

wherein the at least one staging location comprises a mobile preparation table configured to transport printing plates to and from the staging location, the mobile preparation table comprising:

a base having a frame and a plurality of wheels attached to the frame and configured to roll along a floor surface;

a planar preparation surface having a frame pivotally attached to the frame of the base;

one or more physical connection interfaces configured to secure the base mechanically in a fixed position in the staging location; and a processor with a communication interface configured to exchange information between the mobile preparation table and the plate handling system.

42. The plate handling system of claim 41, wherein the mobile preparation table further comprises a mechanism for pivoting the planar preparation surface within a range of angles between a first position parallel to the floor surface and a second position at an angle relative to the first position.

43. The plate handling system of claim 41, further comprising indicia for measuring one or more characteristics of a plate positioned on the preparation surface and a user interface for providing one or more measurements of the characteristics as an input to the processor.

44. The plate handling system of claim 43, wherein the one or more characteristics are selected from the group consisting of: length of the plate, width of the plate, thickness of the plate, weight of the plate, and orientation and/or location of the plate relative to the preparation surface.

45. The plate handling system of claim 44, wherein the one or more sensor systems comprises sensors for determining length, width, and weight of the plate, wherein the processor is configured to determined thickness of the plate based upon length, width, and weight of the plate, and a predetermined value for photopolymer density.

46. The plate handling system of claim 41, further comprising at least one sensor system configured to detect one or more characteristics of a plate positioned on the preparation surface.

47. The plate handling system of claim 46, wherein the planar preparation surface of the mobile preparation table is transparent and the at least one sensor system of the mobile preparation table comprises one or more photodetectors.

48. The plate handling system of claim 47, wherein the one or more photodetectors includes at least one array of photodetectors disposed relative to the transparent planar preparation surface configured to detect a portion of the plate disposed over a portion of the array based upon an absence of ambient light received by a portion of the array blocked by the presence of the plate.

49. The plate handling system of claim 47, wherein the at least one sensor system comprises a photopolymer layer thickness detector and the one or more photodetectors includes an array of photodetectors disposed beneath the transparent planar preparation surface, the sensor system comprising a light source configured to emit a first beam angled toward the plate from beneath the transparent table, and the array configured to detect second and third beams reflected by transitions between the photopolymer layer and layers disposed adjacent the photopolymer layer.

50. The plate handling system of claim 41, wherein the mobile preparation table further comprises a display mounted on the mobile preparation table configured to display selected information exchanged between the mobile preparation table and the plate handling system.

51. The plate handling system of claim 41, wherein the planar preparation surface of the mobile preparation table is transparent.

52. A method for transporting printing plates, the method comprising the steps of:
providing the plate handling system of claim 41;
disposing a printing plate on the planar preparation surface of the mobile preparation table;
moving the mobile preparation table along a path of travel from a plate loading location to processing equipment in a processing location; and
securing the one or more physical connection interfaces of the mobile preparation table to mating interfaces on the processing equipment; and
exchanging information between the mobile preparation table and the processing equipment.

53. The method of claim 52, wherein the step of moving the preparation table along the path of travel comprises pivoting the preparation surface frame relative to the base frame from a first position to a second position in at least one portion of the path of travel.

54. The method of claim 53, wherein at least one of the first or second positions is a position with the preparation surface frame oriented in a horizontal position.

55. A plate handling system for transporting printing plates between workstations in a process workflow, the system comprising:
a plurality of vacuum gripper end effectors configured to grip the printing plates and mounted to a computer controlled transporter, the transporter configured to translate in at least three orthogonal directions and to rotate about at least one rotational axis;
at least one sensor for detecting orientation of the plate relative to at least one staging location in the process workflow; and
a controller, connected to the transporter and the at least one sensor, configured to cause the transporter to move based upon programmed instructions in accordance with information provided by the sensor;
at least one thickness detector configured for measuring thickness of a printing plate relative to a surface of the plate handling system, the surface defining an X-Y plane for receiving the printing plate, the thickness detector comprising:
a sensor positioner controllable in at least Y and Z axes disposed above the surface;
a non-contact distance measurement sensor mounted on the positioner and configured to output a measurement signal indicative of distance along a Z axis perpendicular to the X-Y plane;
a processor configured to control the positioner and to receive a measurement signal from the sensor, the processor programmed with instructions for:
(a) receiving information defining X-Y dimensions and expected location of the plate;
(b) moving the positioner to a first position disposed above a point on the surface not above the expected location of the printing plate;
(c) obtaining a reference Z-distance measurement signal from the sensor for use as a reference Z-distance between the sensor and the surface;
(d) moving the positioner to a second position disposed above a point on the surface above the expected location of the printing plate;
(e) obtaining a second Z-distance measurement signal from the sensor and processing the second Z-distance measurement signal and the reference Z-distance measurement signal to obtain the measured thickness of the printing plate.

56. The system of claim 55, wherein the system is further configured to detect an actual position and angle of the plate on the surface, the processor further programmed with instructions for:
(f) detecting a change in signal received from the sensor while the positioner is in motion from the first position to the second position indicative of a location of a first edge of the plate;
(g) detecting a change in signal received from the sensor while the positioner is in motion between at least two other pairs of points, each pair including one point above the expected location of the printing plate and one point not above the expected location of the printing plate, and detecting respective changes in signals received from the sensor while the positioner is in motion between each pair of points, each change indicative of locations of second and third edges of the plate;
(h) processing the signals indicative of the locations of the first, second, and third edges of the plate to obtain a detected actual position and angle of the plate on the surface.

57. The plate handling system of claim 55, wherein the sensor is a laser triangulation sensor and the positioner comprises a 3-axis robotic rig.

58. The plate handling system of claim 55, wherein the plate includes information encoded as differences in plate thickness along a predetermined path, and the system is further programmed with instructions for moving the positioner along the predetermined path while receiving measurement signals from the sensor, and processing the measurement signals so received to read the encoded information.

59. A method for reading information encoded on a polymer printing plate as differences in polymer thickness along a predetermined path, the method comprising:
providing the plate handling system of claim 58;
disposing the printing plate in a position accessible by the thickness detector;
moving the thickness detector along the predetermined path while receiving measurement signals; and
processing the measurement signals to read the encoded information.

60. A method of processing a printing plate in a plurality of workstations in a process workflow, the method comprising the steps of:
(a) providing a plate handling system for transporting the printing plate from one workstation to another in the process workflow, the plate handling system comprising a computer controlled transporter configured to translate in at least three orthogonal directions and to rotate about at least one rotational axis, end effectors for gripping the printing plates connected to the transporter, at least one sensor for detecting orientation of the plate relative to at least one staging location in the process workflow; and a process controller, the process controller connected to the transporter, to the at least one sensor, and to a computer processor;
(b) sensing, with the at least one sensor, location and orientation of a plate to be transported; and
(c) using the transporter, lifting the plate in a Z direction relative to an XY plane and one or more of: moving the plate in an X direction, moving the plate in a Y direction, and rotating the plate relative to a Z-axis;
wherein the end effectors are configured to grip the printing plate on an upper surface of the plate, and the method comprises applying an image to the upper surface of the plate at an imaging station, and irradiating both the upper surface and an opposite lower surface of the plate at a photopolymer curing station, including curing the photopolymer plate using actinic radiation emitted from radiation sources mounted on a linear stage having a resting location relatively nearer a trailing end of the curing station than to a leading end of the curing station, and pulling the plate onto the curing station in a direction from the leading edge to the trailing edge using the transporter, depositing the plate in a curing location, and the transporter returning to a location that does not interfere with transit of the curing station linear stage.

61. The method of claim 60, comprising grabbing, lifting, and pushing the plate from a trailing edge of the plate to move the plate from the curing location to a washing station receiving position in which at least a portion of the plate is located beneath the curing station linear stage in the resting position.

* * * * *